(12) United States Patent
Volkerink et al.

(10) Patent No.: US 7,412,639 B2
(45) Date of Patent: Aug. 12, 2008

(54) SYSTEM AND METHOD FOR TESTING CIRCUITRY ON A WAFER

(75) Inventors: Erik H. Volkerink, San Jose, CA (US); Ajay Koche, Cupertino, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 998 days.

(21) Appl. No.: 10/155,651

(22) Filed: May 24, 2002

(65) Prior Publication Data

US 2003/0221152 A1    Nov. 27, 2003

(51) Int. Cl.
*G01R 31/28* (2006.01)

(52) U.S. Cl. ...................................... 714/736
(58) Field of Classification Search ................ 714/724, 714/726, 727, 732, 733, 736; 324/754, 755, 324/757, 758, 763, 765
See application file for complete search history.

(56) References Cited

U.S. PATENT DOCUMENTS

| | | | |
|---|---|---|---|
| 5,457,400 A | 10/1995 | Ahmad et al. | |
| 5,477,062 A | 12/1995 | Natsume | |
| 5,504,369 A * | 4/1996 | Dasse et al. | 257/620 |
| 5,539,325 A * | 7/1996 | Rostoker et al. | 324/763 |
| 5,838,163 A * | 11/1998 | Rostoker et al. | 324/763 |
| 5,872,793 A * | 2/1999 | Attaway et al. | 714/726 |
| 5,898,186 A | 4/1999 | Farnworth et al. | |
| 6,000,047 A | 12/1999 | Kamae et al. | |
| 6,265,888 B1 | 7/2001 | Hsu | |
| 6,275,052 B1 | 8/2001 | Hembree et al. | |
| 6,285,200 B1 | 9/2001 | Pace et al. | |
| 6,321,320 B1 | 11/2001 | Fleischman et al. | |
| 6,334,247 B1 | 1/2002 | Beaman et al. | |
| 6,340,823 B1 | 1/2002 | Kitade | |
| 6,366,110 B1 * | 4/2002 | Buck | 324/765 |
| 6,691,269 B2 * | 2/2004 | Sunter | 714/727 |
| 6,710,616 B1 * | 3/2004 | D'Souza | 324/765 |
| 6,717,424 B2 * | 4/2004 | Furuta | 324/755 |
| 6,717,429 B2 * | 4/2004 | Whetsel | 324/765 |
| 6,788,091 B1 * | 9/2004 | Weber | 324/765 |
| 6,816,990 B2 * | 11/2004 | Song et al. | 714/729 |
| 6,928,403 B2 * | 8/2005 | Swoboda | 703/23 |
| 7,089,473 B2 * | 8/2006 | Mates | 714/733 |

FOREIGN PATENT DOCUMENTS

| JP | 6 013 445 | 1/1994 |
|---|---|---|
| JP | 2000100880 | 4/2000 |

* cited by examiner

*Primary Examiner*—James C Kerveros
(74) *Attorney, Agent, or Firm*—Holland & Hart, LLP

(57) ABSTRACT

A system and method in which a plurality of dice on a semiconductor wafer are interconnected to enable efficient testing thereof. In certain embodiments a plurality of dice are interconnected in a manner that enables test data to be communicated from a tester system to a plurality of dice for concurrent testing of such plurality of dice. Depending on the amount of interconnection, all or a portion of each of the plurality of dice may be tested concurrently. In certain embodiments, a plurality of dice are interconnected in a manner that enables test data to be communicated from one die to at least one other die. In certain embodiments, a plurality of dice are interconnected in a manner that enables such dice to be tested concurrently while maintaining a repeatable pattern at the reticle level for fabricating such dice.

26 Claims, 11 Drawing Sheets

SYSTEM AND METHOD FOR TESTING CIRCUITRY ON A WAFER

TECHNICAL FIELD

The present invention relates in general to testing of circuitry on a semiconductor wafer, and more particularly to a system and method for wafer-level testing of circuitry utilizing communicative interconnection between dies on the wafer.

BACKGROUND OF THE INVENTION

During typical semiconductor manufacturing processes, a plurality of integrated circuits are formed as individual dice on a semiconductor wafer. Each semiconductor wafer generally has dozens to hundreds of individual dice formed thereon. Once the dice are formed on a semiconductor wafer, the dice are then tested to determine which dice are functional and which dice are not functional. In most testing procedures, each die is probed using very costly probe equipment while the dice are still on the wafer. This step is also known as "wafer sort."

The purpose of the wafer-level probe test is to determine, as early as possible in the manufacturing process, whether each individual die is defective or not. The earlier a defective die is detected, the less time and expense that is wasted on further processing of defective dice. That is, if it is determined that a detected defect cannot be repaired, the time and expense of completing a chip assembly will not be expended.

Traditionally, probe equipment has been capable of only testing one or a few dice at a time. In traditional testing procedures, probe equipment is used to contact each bonding pad (or "access pad") on an individual die with a separate probe needle. More specifically, in traditional testing procedures, each die is probed in order to determine whether it passes a very basic test (e.g., a test for electrical opens or electrical shorts). In most cases, a full functional test may also be performed using the probe equipment. A probe (which may be referred to herein as a "stylus") may be brought into contact with one or more bonding pads of a die in order to communicate signals (e.g., a test pattern) to the die and to receive the signals output by the die responsive to the input signals. The probe may be communicatively coupled to an external Automated Test Equipment (ATE) that is operable to generate the signals to be input to a die and to evaluate the signals output by the die in order to determine whether the die is functioning properly. Traditional testing procedures generally involve contacting access pad(s) of each individual die with a probe in series. That is, the dice of a wafer are generally tested one at a time in series using a probe to contact the pad(s) of each die. In some instances a probe card may be utilized that includes a sufficient number of pins to enable multiple dice to be tested concurrently. That is, a probe card may comprise a sufficient number of pins to enable access pads of multiple dice to be contacted simultaneously for testing of such multiple dice. As described further below, it is generally desirable to test a large number of dice in parallel because of the time required for moving the probe card from one die (or set of dice) to another die (or set of dice), which may be on the order of the actual testing time.

Traditional testing procedures are problematic because of their serial nature. For example, using a probe to test one die after another die results in an undesirably long time being required for testing all of the dice of a wafer, which effectively increases the overall cost of testing the dice. Probes used for testing the dice are generally very expensive, and it is therefore undesirable to have a probe tied up for a long time testing each die. Additionally, while certain probe implementations may provide a sufficient number of pins to enable a plurality of dice to be tested simultaneously, such testing is limited by the configuration (e.g., the number of pins) of the probe. For instance, a probe that comprises sufficient pins for contacting two dice simultaneously is limited to testing of two dice concurrently. Thus, if it is desired to test four dice, the probe configuration is incapable of testing all four dice simultaneously. Thus, generally the communication to the dice for testing is limited by the probe card's configuration. In addition, physical constraints may limit the amount of parallelism that may be achieved through modifying a probe's configuration (e.g., to include more pins). For example, in some instances it may not be technologically possible to arrange the pins of a probe in a manner (e.g., sufficiently close together) to enable testing of a desired number of dice, or implementing such an arrangement may not be cost effective.

Further, the life of a probe is generally measured by the number of times it touches down on dice (e.g., a probe may have a typical life of one million touch downs). Traditional testing procedures that require a probe to touch down on one (or a few) dice at a time effectively increases the wear of a probe. For instance, a probe having a life of one million touch downs that is utilized in a traditional testing procedure in which one die at a time is tested will be capable of testing one million dice. Considering the cost associated with such probes, it is generally desirable to effectively prolong the life of a probe by testing as many dice as possible during the probe's life.

More recently, testing techniques have been proposed that enable parallel testing of multiple dice of a wafer with a single probe. Examples of such parallel testing schemes that have been proposed include those described in U.S. Pat. No. 5,504,369 titled "Apparatus for Performing Wafer Level Testing of Integrated Circuit Dice" issued Apr. 2, 1996 to Dasse et al., U.S. Pat. No. 5,898,186 titled "Reduced Terminal Testing System" issued Apr. 27, 1999 to Farnworth et al., and U.S. Pat. No. 6,340,823 B1 titled "Semiconductor Wafer Having a Multi-Test Circuit, and Method for Manufacturing a Semiconductor Device Including Multi-Test Process" issued Jan. 22, 2002 to Kitade. Such parallel testing schemes proposed in the prior art generally provide for one or more wafer-level access pads arranged on a wafer external to the dice, and such access pads may be contacted by a probe to input signals and/or to receive output signals. In these testing schemes, the wafer-level access pads may each be coupled to a plurality of dice, thereby enabling input signals from a probe to be communicated to such plurality of dice in parallel and/or enabling output signals from the plurality of dice to be communicated to the probe.

Parallel testing schemes of the prior art have primarily focused on avoiding contact by a probe with access pads of an individual die in order to prevent damaging the die's access pads. While parallel testing solutions of the prior art propose communicatively coupling a wafer-level access pad to multiple dice to enable data to be communicated from the access pad to the dice in parallel (and vice-versa), such solutions do not provide a communication scheme for improving/optimizing efficiency and reliability of the testing. That is, the primary focus of prior parallel testing solutions has been to arrange wafer-level access pads that are each coupled to a plurality of dice so as to prevent damaging the access pads of the dice with a test probe, and such solutions have neglected to provide an interconnection scheme that enables test data to be communicated from one die to another die in a manner to improve efficiency and/or reliability of the testing. Further, parallel testing solutions proposed in the prior art are difficult and/or not cost effective to manufacture.

Once the wafer-level testing is completed, the dice are usually then separated or singulated into individual die using any one of a variety of singulation techniques. Typically, the dice are singulated by use of a wafer saw, which grinds the wafer along cut zones (usually referred to as "scribe lines") separating the individual die. In most cases, each die is then packaged in an integrated circuit package. Once the dice have been packaged, thorough electrical testing is typically performed on each of the packaged integrated circuits. The purpose of the thorough electrical testing is to determine whether each packaged integrated circuit properly performs the functionality specified by the designer. The packaged integrated circuits determined to function properly are then sold.

Sometimes process monitors are placed on the scribe lines and on other places of the wafer. Such process monitors typically comprise small circuitry (e.g., a ring oscillator) that is used to measure process parameters. However, this measurement cannot be used to point to certain defects on dies in isolation. It can only be used to get data about different process parameters that impact a portion of the wafer, beyond a single die.

In some cases, the packaged integrated circuits also undergo a reliability testing procedure called burn-in. Burn-in testing involves the testing of an integrated circuit for an extended period of time while its temperature is elevated above room temperature. In some cases, the heat generated by the integrated circuit itself is sufficient to elevate its temperature by a sufficient amount for the burn-in testing. In other cases, the temperature of the integrated circuit is raised by an external apparatus external (e.g. a burn-in oven in which the packaged integrated circuits are placed).

Instead of or in addition to burn-in testing, cold temperature reliability testing may be performed. Cold temperature reliability testing involves the testing of an integrated circuit for an extended period of time while its temperature is decreased below room temperature.

Semiconductor manufacturers spend a significant amount of money packaging defective dice which pass the testing performed during probing, but which do not pass the reliability testing after packaging. The cost saving goal of detecting and screening out defective dice as early as possible in the manufacturing process is especially important in the context of multi-chip modules (MCMs). Multi-chip modules (MCMs) are electronic modules that include a plurality of integrated circuit dice which are packaged together as one unit. Multi-chip modules are becoming more widely used.

For multi-chip modules, it is quite costly to replace one or more failed dice once the dice have been bonded onto a substrate. Therefore, it is desirable to determine whether a die is fully functional and is reliable before the die is packaged as part of a multi-chip module. In addition, many manufacturers of multi-chip modules are requiring that semiconductor manufacturers sell them fully tested "known good dice" that have passed reliability tests and that are not packaged in an integrated circuit package.

BRIEF SUMMARY OF THE INVENTION

The present invention is directed to a system and method in which a plurality of dice on a semiconductor wafer are interconnected in a manner that enables efficient testing thereof. For example, in certain embodiments a plurality of dice are interconnected in a manner that enables test data to be communicated from a tester system, which may be external to the semiconductor wafer (e.g., via a test probe) or which may be implemented on the semiconductor wafer (e.g., as Built-In Self Test circuitry), to a plurality of dice for concurrent testing of such plurality of dice. Depending on the amount of interconnection, all or a portion of each of the plurality of dice may be tested concurrently. For example, in certain implementations test data may be communicated to a first die, and a second die may be interconnected to the first die such that all or a portion of such second die is tested concurrently with the first die.

In certain embodiments of the present invention, a plurality of dice are interconnected in a manner that enables test data to be communicated from one die to at least one other die. Thus, for example, input and/or output test data may be communicated from at least one die to at least one other die. In certain embodiments of the present invention, a plurality of dice are interconnected in a manner that enables such dice to be tested concurrently while maintaining a repeatable pattern at the reticle level for fabricating such dice.

As an example, certain embodiments of the present invention provide a system for testing a plurality of dice on a semiconductor wafer, such system comprising a communication system interconnecting the plurality of dice on the semiconductor wafer for communicating test data from at least one of the plurality of dice to at least one other of the plurality of dice.

As another example, certain embodiments of the present invention provide a system for testing a plurality of dice on a semiconductor wafer, such system comprising circuitry fabricated on a semiconductor wafer, wherein such circuitry is defined by a repeatable reticle pattern. Further, the circuitry comprises a communication system interconnecting a plurality of dice on the semiconductor wafer for concurrently communicating test data to the plurality of dice.

Accordingly various embodiments of the present invention may provide several technological advantages. As one example, certain embodiments provide a test scheme that enables multiple dice on a wafer to be tested concurrently while maintaining regularity at the wafer level (i.e., a repeatable pattern at the reticle level). As another example, certain embodiments provide a test scheme in which a plurality of dice on a wafer are communicatively interconnected such that test data may be communicated from at least one die to at least one other die. As a further example, certain embodiments of the present invention provide a test scheme that provides great efficiency in testing dice because, for instance, multiple dice (or at least portions thereof) may be tested concurrently (thereby reducing the overall amount of time required for testing the dice of a wafer).

Also, certain embodiments of the present invention provide a test scheme that provides improved utilization of test resources, such as a test probe. For instance, considering that some test resources, such as a test probe, are relatively expensive, it is often desirable to obtain maximum utilization of such resources. Certain embodiments of the present invention enable improved utilization of resources, such as a test probe. Additionally, certain embodiments of the present invention provide efficient utilization of wafer and/or dice area for implementing a dice testing scheme. For example, certain embodiments may share area on a plurality of dice to implement a test scheme for such dice. For instance, certain embodiments may implement a test scheme (e.g., BIST circuitry) with portions of such test scheme distributed on various different dice. Further, certain embodiments of the present invention provide a test scheme that enables one die to test one or more other dice of a wafer. Accordingly, such test schemes may provide for improved signal integrity in testing dice on a wafer because, for instance, the tester circuitry is in close proximity to the dice logic being tested. Additionally, the same technologies are preferably used for implementing the test circuitry and/or communication scheme interconnecting a plurality of dice as is used for implementing the dice logic, which may improve the scalability and signal integrity of embodiments of the present invention. Further, certain embodiments of the present invention may be used to implement loop back testing.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1A:
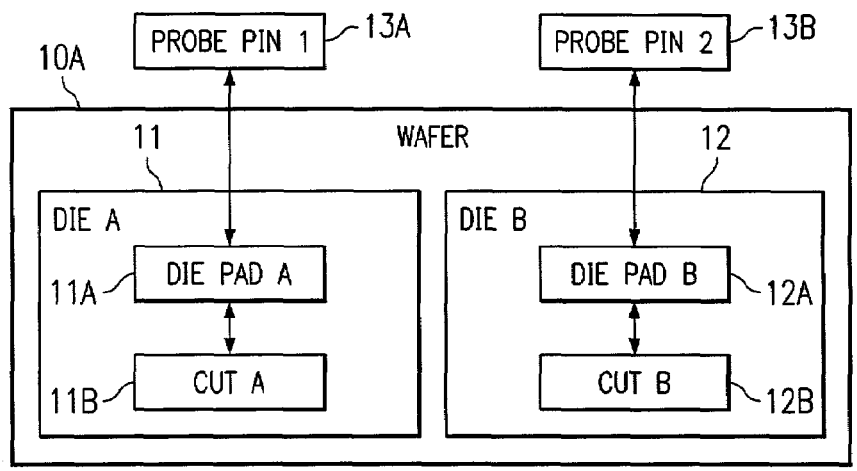
FIGS. 1A-1C show example configurations of the existing art for testing dice of a semiconductor wafer.
Figure 1B:
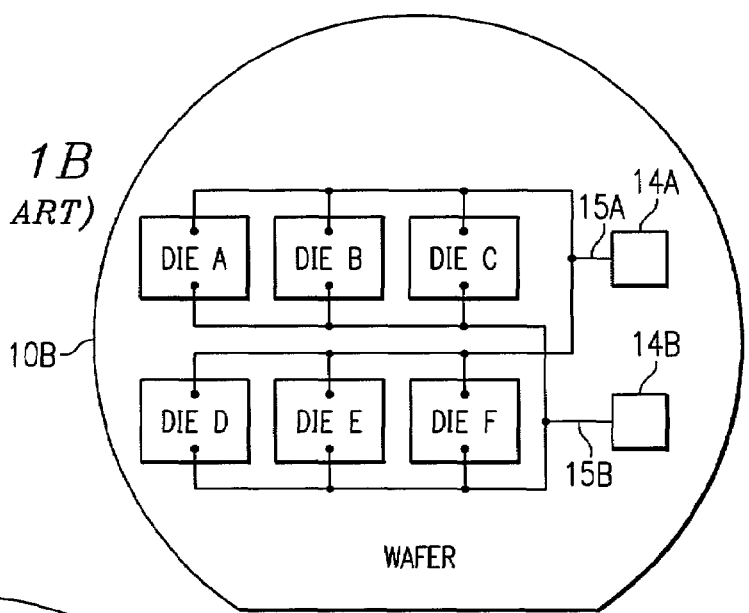
Figure 1C:
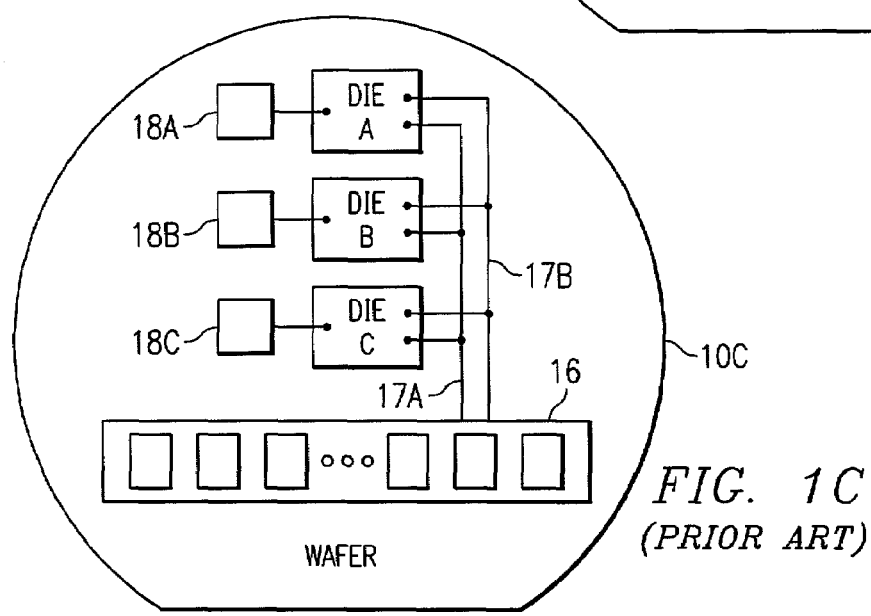

Turning to FIGS. 1A-1C, example configurations of the existing art for testing dice of a semiconductor wafer are shown. FIG. 1A shows an example of a traditional testing configuration. As shown, wafer 10A comprises die A (labeled 11 in FIG. 1A) and die B (labeled 12 in FIG. 1A), which may be singulated during the singulation process (e.g., and may be packaged as an integrated circuit). Of course, wafer 10A may comprise many more than two dice, but only two are shown in FIG. 1A for simplicity. Die A includes circuitry ("CUT A") 11B, and die B likewise includes circuitry ("CUT B") 12B. Such circuitry may be referred to herein as the CUT of a die. Such circuitry 11B and 12B of dice A and B are typically identical, but in some manufacturing processes, differing circuitry may be included at different dice of a wafer.

Die A also includes one or more access pads 11A that are communicatively coupled to circuitry 11B, and die B likewise includes one or more access pads 12A that are communicatively coupled to circuitry 12B. Access pads 11A and 12A may be contacted by a test probe to provide and receive signals from circuitry 11B and 12B, respectively, in order to test the functionality of such circuitry. For example, probe section 13A of a probe card may comprise a plurality of pins that may be utilized to contact access pads 11A of die A for testing circuitry 11B. Further, the probe card may further comprise a second section 13B comprising a plurality of pins that may be utilized to contact access pads 12A of die B for testing circuitry 12B. Thus, a probe card may comprise a sufficient number of pins (e.g., sections 13A and 13B) to enable the probe card to simultaneously contact access pads of multiple dice, in which case the probe card may test a plurality of dice (e.g., dice A and B in FIG. 1A) simultaneously, and thereafter the probe card may be moved to contact another set of dice on the wafer to be tested in series. Alternatively, the probe card may comprise only enough pins to contact the access pads of one die at a time, in which case the probe card must contact each die of a wafer in series. The test probe card may input a test pattern, for example, and may receive output signals from the circuitry of the respective die being tested. The probe card may be communicatively coupled to an Automated Test Equipment (ATE) that is used to generate the test patterns to be input to the dice and to evaluate the received output signals to determine whether the circuitry of each die is functioning properly.

Such traditional testing configuration requires that each die pad be contacted by a probe pin for each die to be tested. That is, in traditional testing configurations, each probe section (e.g., probe pin sections 13A and 13B) communicates with one unique die on the wafer at a time. This traditional testing procedure is problematic because of its serial nature. For example, using a probe to test each die in series results in an undesirably long time being required for testing all of the dice of a wafer, which effectively increases the overall cost of testing the dice. Further, the time required for moving the probe card from one die (or set of dice) to another die (or set of dice) on a wafer (i.e., the "index time") generally increases the time required for testing the dice of a wafer substantially. For instance, the time required for moving the probe card may be on the order of the actual die test time. While probe cards may be configured having sufficient number of pins to enable testing of multiple dice in parallel, the probes are generally very expensive, and therefore it is typically not cost-effective to have a probe card that comprises sufficient number of pins to simultaneously test many dice of a wafer.

As described above, certain probe implementations may provide a sufficient number of pins to enable a plurality of dice to be tested simultaneously using a single probe. However, such testing is limited by the configuration (e.g., the number of pins) of the probe. For instance, a probe that comprises sufficient pins for contacting two dice (e.g., dice A and B of FIG. 1A) simultaneously is limited to testing of two dice concurrently. Thus, if it is desired to test four dice, for example, the probe configuration is incapable of enabling all four dice to be tested simultaneously. Thus, generally the communication to the dice for testing is limited by the probe card's configuration (e.g., the number of pins available on the probe card). Physical constraints may limit the amount of parallelism that may be achieved through modifying a probe's configuration (e.g., to include more pins). For example, in some instances it may not be technologically possible to arrange the pins of a probe in a manner (e.g., sufficiently close together) to enable concurrent testing of a desired number of dice, or implementing such an arrangement may not be cost effective.

More recently, testing techniques have been proposed that enable parallel testing of multiple dice of a wafer with a single probe through communication schemes implemented on the wafer. For instance, FIG. 1B illustrates an example of a parallel testing configuration proposed in the prior art (see e.g., U.S. Pat. No. 5,898,186 titled "Reduced Terminal Testing System" issued Apr. 27, 1999 to Farnworth et al.). As shown, wafer 10B comprises dice A-F. Of course, wafer 10B may comprise many more dice than shown in the example of FIG. 1B, but only six dice are shown in FIG. 1B for simplicity. Each die includes circuitry (or "CUT") (not specifically shown in FIG. 1B).

In the example configuration of FIG. 1B, wafer-level access pads 14A and 14B are provided, which are arranged on wafer 10B external to dice A-F and are each communicatively coupled to dice A-F. Specifically, communication path 15A couples access pad 14A to multiple dice A-F, and communication path 15B couples access pad 14B to multiple dice A-F. Access pads 14A and 14B may be contacted by test probe pins to provide and receive signals from the circuitry of dice A-F in order to test the functionality of such circuitry. This arrangement enables a signal input by a probe to access pad 14A to be communicated via communication path 15A to each of dice A-F in parallel. Further, output signals from dice A-F may be communicated via communication path 15B to access pad 14B.

Another example of a parallel testing configuration proposed in the prior art (see e.g., U.S. Pat. No. 6,340,823 B1 titled "Semiconductor Wafer Having a Multi-Test Circuit, and Method for Manufacturing a Semiconductor Device Including Multi-Test Process" issued Jan. 22, 2002 to Kitade) is shown in FIG. 1C. As shown in FIG. 1C, wafer 10C comprises dice A-C. Of course, wafer 10C may comprise many more dice than shown in the example of FIG. 1C, but only three dice are shown for simplicity. Each die includes circuitry (or "CUT") (not specifically shown in FIG. 1C).

In the example configuration of FIG. 1C, a group of wafer-level access pads 16 are arranged on wafer 10C external to dice A-C, and one or more of such access pads 16 are, in turn, communicatively coupled to each of dice A-C. Specifically, communication paths 17A and 17B couple access pads 16 to multiple dice A-C. Access pads 16 may be contacted by test probe pins to input signals from an ATE to the circuitry of dice A-C. Further, each of dice A-C may have a wafer-level access pad communicatively coupled thereto to receive output signal(s) from such die. For instance, wafer-level access pad 18A is communicatively coupled to die A; wafer-level access pad 18B is communicatively coupled to die B; and wafer-level access pad 18C is communicatively coupled to die C. Output signals may be received for each die by contacting a test probe pin to the die's respective wafer-level access pad 18A, 18B, 18C. The arrangement of FIG. 1C enables a signal input by a probe to access pads 16 to be communicated via communication paths 17A and 17B to each of dice A-C in parallel. Additionally, output signals from dice A-C may be communicated in parallel to their respective wafer-level output pads 18A, 18B, 18C.

While parallel testing solutions of the prior art propose communicatively coupling a wafer-level access pad to multiple dice to enable data to be communicated from the access pad to the dice in parallel (and vice-versa), such solutions do not provide a communication scheme for improving/optimizing efficiency and reliability of the testing. The primary focus of prior parallel testing solutions has been to arrange wafer-level access pads that are each coupled to a plurality of dice so as to prevent damaging the access pads of the dice with a test probe, and such solutions have neglected to provide an interconnection scheme that enables test data to be communicated from one die to another die in a manner to improve efficiency and/or reliability of the testing.

The parallel testing solutions proposed in the prior art have several problems and/or shortcomings. As one example, parallel testing solutions of the prior art are difficult and/or not cost effective to manufacture. For instance, in typical manufacturing of circuits, photomasks are used for defining layers of a circuit. A photomask is (typically) a 5 inch glass plate that has a pattern of clear and opaque areas repeated over its surface that defines a single layer of a circuit. Tens of masks are commonly used to describe an entire circuit. Generally, photomasks are generated from circuit designs laid out with the aid of Computer Aided Drafting (CAD) tools. The transfer of the circuit design to the photomask is typically done by scanning a computer-controlled optical or electron beam across a photographic plate in the given (generally ten-fold enlarged) pattern for a layer of the circuit. This pattern, called a reticle, is then checked for correctness, and a reduced version of it is reproduced and (repeatedly) projected side by side on a wafer. A reticle may define a pattern that encompasses one die or a plurality of dice. For instance, a reticle may define a pattern that when applied to a wafer generates a plurality of dice on the wafer. A series of reproduced masks, called submasters, are then created and sent to a wafer fabrication laboratory where they are often used to produce thousands of wafers per week.

Reticles and the process for making and using such reticles for manufacturing circuitry are well known in the art. As is well known, making a reticle is generally very expensive. As those of skill in the art will appreciate, to reduce the cost associated with manufacturing dice, it is generally desirable to utilize a reticle(s) that provide regularity at the wafer level. That is, it is generally desirable for a reticle to define a regular, repeatable pattern. For instance, as a reticle is generally repeatedly reproduced side by side in creating a final mask for the circuitry to be fabricted on a wafer, it is desirable for the reticle to have a repeatable pattern. Having regularity at the wafer level is desired to decrease the cost of the wafer. Regularity at the wafer level means having alignment of the interfaces of a reticle (e.g., alignment of the inputs and outputs). Thus, repeatability of the reticle pattern results in regularity at the wafer level.

The parallel wafer testing schemes of the prior art, such as those proposed by U.S. Pat. Nos. 5,898,186 and 6,340,823 B1, do not provide regularity at the wafer level. That is, such wafer testing schemes require structures that are not repeated for each reticle of the wafer. For example, such testing schemes require connections from a die to a wafer-level access pad that are not implemented in a regular, repeated manner at the reticle level. Accordingly, it is difficult and/or expensive to manufacture a wafer that implements a testing scheme such as those proposed in FIGS. 1B and 1C described above. Because of the irregular structure of such prior art testing schemes, multiple masks may be required to be used for designing the desired circuitry on the wafer. Under current manufacturing equipment capabilities in terms of switching multiple masks, it is not economical to implement such an irregular pattern in the manufacturing process. Thus, in many manufacturing processes, the parallel testing schemes proposed in the prior art do not provide an economical solution because they do not provide regularity at the wafer level. That is, such parallel testing schemes of the prior art do not provide alignment of the interfaces of a reticle, and thus do not provide a repeatable reticle pattern that may be used in manufacturing a wafer.

Various embodiments of the present invention are now described with reference to FIGS. 2-10, wherein like reference numerals represent like parts throughout the several views. As described below, certain embodiments of the present invention enable a wafer-level test scheme that enables a plurality of dice to be tested concurrently, while providing regularity at the wafer level (with a repeatable reticle pattern), thus making manufacturing feasible and/or cost effective. That is, certain embodiments of the present invention provide a test scheme in which multiple dice are communicatively interconnected to enable such multiple dice to be tested concurrently, while providing regularity at the wafer level. As also described below, certain embodiments of the present invention provide a wafer-level testing solution in which multiple dice to be tested are communicatively interconnected to enable test data to be communicated from one die to another die. As described in greater detail below, having multiple dice communicatively interconnected such that test data (e.g., digital data and/or analog signals) may be communicated from at least one die to at least one other die may enable efficient testing of the dice, efficient use of wafer area for implementing the testing scheme, efficient use of resources (e.g., test probe) required for testing the dice, one die to test another die, and/or may enable a repeatable pattern to be maintained at the reticle level, thereby providing regularity at the wafer level. Further, certain embodiments of the present invention provide a communication scheme for interconnecting dice on a wafer that enables testing of the dice with greater accuracy, greater communication bandwidth, and/or with greater signal integrity than is available in traditional testing schemes of the prior art.

Accordingly, unlike traditional testing configurations, such as that of FIG. 1A, embodiments of the present invention break the barrier of one probe pin per die pad to be tested, thereby reducing the requirements on probe pins that are needed to perform a certain degree of multi-site testing. That is, the interconnection schemes of embodiments of the present invention break the barrier of limiting the number of dice that may be tested concurrently based on the test probe's configuration. Further, embodiments of the present invention provide die interconnection schemes that improve on the parallel testing solutions of the prior art, such as those of FIGS. 1B and 1C. According to various embodiments of the present invention, various interconnection schemes are identified that may be utilized for inputting test data to dice and for receiving output from dice. Further, the testing configuration may be implemented on a die, a set of dice, and/or between dice for testing one or more dice, which means that wafer area outside a certain die may be used to support the testing of that die. Further, certain implementations utilize actual die area for implementing a testing scheme, rather than limiting the test scheme implementation solely to unused metal areas (or "scribe lines") available on a wafer. As a further example, certain embodiments of the present invention enable the test scheme to be implemented with regularity at the wafer level (i.e., having a repeatable pattern at the reticle level). Also, certain testing configurations of the present invention enable a reduction in probe pin requirement for testing each die, which increases the degree of multi-site testing with a given probe card and/or reduces the cost for a given multi-site test. Various other advantages are described in further detail below.

Figure 2:
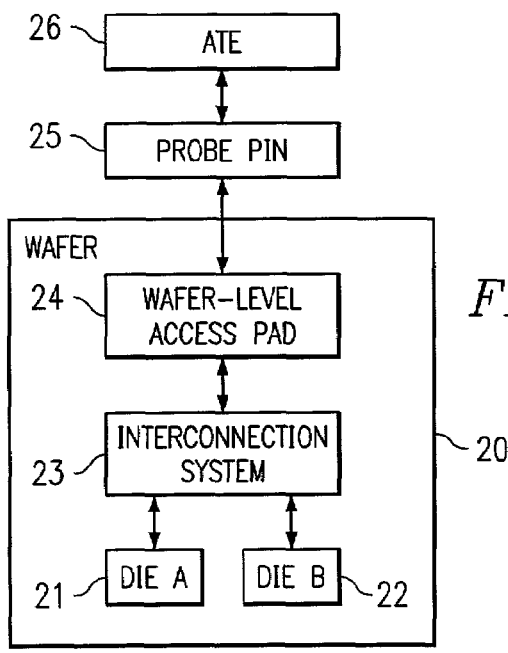
FIG. 2 shows an example overview of embodiments of the present invention.

Turning to FIG. 2, an example overview of embodiments of the present invention is shown. It should be understood that FIG. 2 is an illustrative block diagram, and the various components therein are not shown to scale. As shown, wafer 20 comprises die A (labeled 21 in FIG. 2) and die B (labeled 22 in FIG. 2), which may be singulated during the singulation process (e.g., and may be packaged as an integrated circuit). Of course, wafer 20 may comprise many more than two dice, but only two are shown in FIG. 2 for simplicity. Dice A and B each include circuitry (or "CUT") (not specifically shown in FIG. 2). Such circuitry of dice A and B are typically identical, but in some manufacturing processes, differing circuitry may be included at different dice of wafer 20.

Wafer 20 may be formed of a variety of materials, including silicon and gallium-arsenide. Wafer 20 is not limited to any particular shape or size, although currently 6" and 8" diameter wafers are popular. Dice A and B are not limited to any particular type of dice. For example, dice A and B may be formed of various materials, including silicon and gallium-arsenide. Dice A and B may be such as are used with any of various memory chips, microprocessors, or ASICs, as examples. The materials mentioned herein, such as pads, conductive paths, and dice, may be constructed according to various well known techniques from various well known materials.

In the example of FIG. 2, dice A and B are communicatively interconnected by interconnection system 23. In certain embodiments, interconnection system 23 enables test data (e.g., input test data and/or output test data) to be communicated from one of dice A and B to the other of such dice.

Various examples of interconnection schemes that may be implemented in accordance with embodiments of the present invention are described further hereafter in conjunction with FIGS. 4-8. Interconnection system 23 further enables communicative coupling between one or more wafer-level access pads 24 and dice A and B. While shown and described logically herein as a "wafer-level" access pad, access pad(s) 24 may, in some embodiments, actually comprise one or more access pads (e.g., bonding pads) of a die, rather than (or in addition to) access pads implemented on wafer 20 external to the dice. For instance, access pads of a die (such as pads 11A of die A in FIG. 1A) may be utilized for providing and receiving test data to/from dice A and B of wafer 20. For example, in certain implementations, access pad(s) of die A may be accessed to input test data to dice A and B via interconnection system 23, as well as to receive output test data from dice A and B via interconnection system 23. Thus, although wafer-level access pad(s) 24 is shown in FIG. 2 as a separate access pad that is external to dice A and B, in some embodiments of the present invention, such access pad(s) 24 may be implemented as one or more access pads of a die.

Access pad(s) 24 may be contacted by pin(s) of a test probe 25 to provide and receive signals from the circuitry of dice A and B in order to test the functionality of such circuitry. For instance, test probe 25 may be brought into contact with access pad(s) 24 to input a test pattern, for example, and may receive output signals from the circuitry of dice A and B. Test probe 25 may be communicatively coupled to an ATE that is used to generate the test patterns to be input to the dice and to evaluate the received output signals to determine whether the circuitry of each die is functioning properly.

Figure 3:
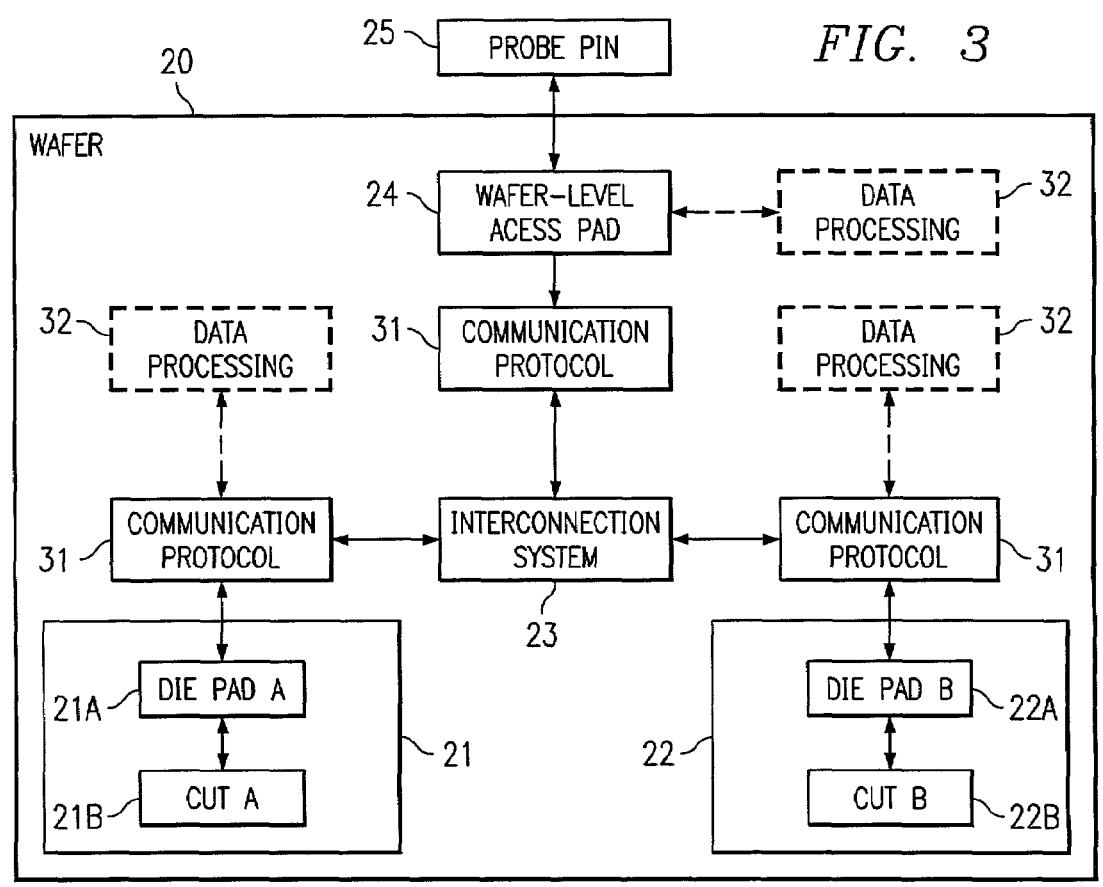
FIG. 3 shows the example overview of FIG. 2 in greater detail.

Turning to FIG. 3, the example overview of FIG. 2 is shown in greater detail. It should be understood that FIG. 3 is an illustrative block diagram, and the various components therein are not shown to scale. As shown, dice A and B (labeled 21 and 22, respectively) may each comprise circuitry, such as CUT 21B and CUT 22B. Further, such circuitry of dice A and B may be communicatively coupled to a die access pad, such as access pads 21A and 22A. As described above, in certain implementations, wafer-level access pad(s) 24 may comprise one or more such die pads 21A and/or 22A. As further shown in FIG. 3, a communication protocol 31 may be implemented for interconnection system 23. As described in greater detail hereafter, interconnection system 23 and communication protocol 31 may vary in complexity in various different embodiments. Also, in certain embodiments, data processing 32 may be implemented at the wafer and/or die level to facilitate the dice testing procedure.

In view of the above overview, it should be recognized that the testing system in accordance with embodiments of the present invention may comprise one or more of at least the following subsystems: 1) wafer-level access subsystem 24, 2) interconnection subsystem 23, 3) communication protocol subsystem 31, and 4) data processing subsystem 32. As is described further below, certain embodiments of the present invention provide an interconnection subsystem 23 that enables concurrent testing of multiple dice such that the number of dice that may be tested concurrently is not limited by the test probe's configuration (e.g., the number of pins on a test probe). Such concurrent testing of multiple dice may result in more reliable testing (e.g., with improved signal integrity), greater efficiency in testing the dice, and/or more effective utilization of valuable resources (such as the test probe). Further, preferably the test scheme is implemented in a repeatable pattern at the reticle level, making manufacturing of a wafer implementing such test scheme cost effective, as opposed to the prior art testing techniques of FIGS. 1B and 1C.

Additionally (or alternatively), interconnection subsystem 23 may comprise multiple dice communicatively interconnected such that test data is communicated from at least one die to at least one other die. Such interconnection scheme may provide several advantages. As one example, having multiple dice communicatively interconnected such that test data is communicated from one die to at least one other die may enable regularity to be maintained at the wafer level while implementing a test scheme that enables concurrent testing of multiple dice. Further, such an interconnection scheme may, in certain implementations, enable one die to be used for testing at least one other die. That is, the interconnection scheme may enable circuitry implemented at one or more dice to be used for testing one or more other dice on a wafer.

Thus, as shown in FIG. 3, interconnection 23 interconnects one die with one or more other dice and/or the wafer-level access subsystem 24. For example, interconnection subsystem 23 preferably enables test data to be communicated from one die to one or more other dice. Note that the singulation process will destroy interconnection subsystem 23 after the wafer testing process. This is, however, not a problem because the use of interconnection subsystem 23 and the economic benefit associated therewith occurs in the wafer testing process.

As for the wafer-level access subsystem 24, it provides an interface for probe pin(s) 25 for performing testing of dice A and B of wafer 20. As mentioned above, it should be understood that the conventional die pads (e.g., die pads 11A of die A in FIG. 1) can be used for wafer-level access in certain implementations. However, in certain implementations, potentially additional or modified observation or control points can be introduced for wafer-level access. For example, extra large pads for high performance probes (high frequency and high accuracy) may be implemented on wafer 20 and multiplexed to multiple dice via interconnection subsystem 23 in certain embodiments. In certain implementations, wafer-level access pad(s) 24 may include an analog to digital (A/D) converter and/or a digital to analog (D/A) converter.

As for the communication protocol subsystem 31, it establishes a protocol for communication between dice via interconnection subsystem 23. For example, communication protocol subsystem 31 may decode or encode the information being communicated to/from dice A and B of wafer 20. More specifically, communication protocol subsystem 31 establishes an interface between (1) the wafer-level access subsystem 24 and the interconnection subsystem 23, and (2) the interconnection subsystem 23 and the dice A and B (e.g., the CUT of each die). For example, communication protocol subsystem 31 may comprise synchronization circuitry, a scan chain, a multiplex/de-multiplex based broadcasting circuitry, a complex Code-Division Multiple Access (CDMA) or Time-Division Multiple Access (TDMA) system, or it may, in certain implementations, be as simple as a conductive wire.

In certain embodiments, protocol subsystem 31 may comprise a buffer, such as a First In, First Out (FIFO) buffer, that may be used to queue up input data. Such buffer may enable tests to be conducted at higher frequencies, may enable greater utilization of resources, and/or may provide improved signal integrity. For example, while resources for inputting test data are not being used for testing the wafer (e.g., the dice are executing in accordance with data previously input thereto and/or test results are being output), such input resources may be used to input test data to a buffer for the dice. Thereafter, when the dice are ready to receive new test data, such data is readily available in the buffer and may be efficiently provided to the dice. Thus, the data may be input to buffers for the dice, and the buffers may be used to satisfy bursts of input of test data to the dice.

As for the data processing subsystem 32, it enables processing of the test data in order to facilitate the test solution. For example, such data processing subsystem 32 may comprise compression and decompression circuitry, which may enable reduction in the interconnection requirement between dice and access pads. Moreover, wafer-level signature and/or register circuitry may be included in data processing subsystem 32, which may enable the time when a test is performed to be decoupled from the time the test results are processed. This can be useful in cases where not all output signals can be probed during the test. Additionally, pattern comparison systems may be implemented to enable comparison of die test results (or output) with broadcasted expected test results input to the pattern comparison system from an ATE. In certain implementations, an advanced data processing subsystem 32 may be utilized to optimize the wafer-level test. For instance, a dynamic wafer-level test management system may be implemented using a FPGA or MPU, as examples, as described further below. As a further example, data processing subsystem 32 may comprise logic for comparing the outputs of dice being tested (e.g., with each other and/or with expected output data).

In operation, probe pin(s) 25 is brought into contact with wafer-level access pad(s) 24 (which may be implemented as a die's access pad, as mentioned above). From wafer-level access pad(s) 24, testing data is transferred using the communication protocol 31 and interconnection system 23 to dice A and B and, in some implementations, to data processing system 32. As described further below, the testing configuration may be implemented anywhere on wafer 20, e.g. on a dedicated die (e.g., such as described with FIG. 11), on a portion of multiple dice (e.g., such as described with FIG. 10), on the wafer's boundary edges, and/or on the wafer's sawing edges (or "scribe lines"). Accordingly, although various elements of the wafer-level testing system, such as the interconnection system 23, communication protocol 31, data processing 32, and wafer-level access pad(s) 24, are shown as being implemented outside of the boundaries of dice A and B in FIGS. 2 and 3, this is intended only as an example schematic to illustrate elements that may be implemented in embodiments of the testing system and their logical arrangement. The example representations of FIGS. 2 and 3 are not intended to preclude implementations in which one or more elements of the wafer-level testing system are implemented within one or more dice.

Embodiments of the present invention provide several technological advantages. As one example, certain embodiments provide a test scheme that enables multiple dice on a wafer to be tested concurrently while maintaining a repeatable pattern in the reticle, thereby enabling regularity at the wafer level. As another example, certain embodiments provide a test scheme in which a plurality of dice on a wafer are communicatively interconnected such that test data may be communicated from at least one die to at least one other die. As a further example, certain embodiments of the present invention provide a test scheme that provides great efficiency in testing dice because, for instance, multiple dice (or at least portions thereof) may be tested concurrently (thereby reducing the overall amount of time required for testing the dice of a wafer). Even if all dies cannot always be tested concurrently, but only sequentially (e.g. due to a limited interconnection), then there is still an advantage of using the test techniques described herein. In traditional testing techniques, the index time (i.e. the time to move the probecard) is a significant portion of the total test time. By using embodiments of the present invention, other dies can be tested without having to move the probecard, i.e. distributing the long index time across the test of multiple dies.

Also, certain embodiments of the present invention provide a test scheme that provides improved utilization of test resources, such as a test probe. For instance, considering that some test resources, such as a test probe, are relatively expensive, it is often desirable to obtain maximum utilization of such resources. Certain embodiments of the present invention enable improved utilization of resources, such as a test probe. Additionally, certain embodiments of the present invention provide efficient utilization of wafer and/or dice area for implementing a dice testing scheme. For example, certain embodiments may share area on a plurality of dice to implement a test scheme for such dice. For instance, as described further with FIG. 10, certain embodiments may implement a test scheme (e.g., BIST circuitry) with portions of such test scheme distributed on various different dice. Further, certain embodiments of the present invention provide a test scheme that enables one die to test one or more other dice of a wafer. Accordingly, such test schemes may provide for improved signal integrity in testing dice on a wafer because, for instance, the tester circuitry is in close proximity to the dice logic being tested and is also implemented using the same technologies.

The subsystems of the testing configuration shown in FIG. 3 may, in various embodiments, be arranged in many different ways. For instance, the wafer-level testing solution of the present invention may comprise any of many different schemes for interconnecting dice for testing such dice. In general, testing of dice comprises information download (e.g., from an ATE/test probe to the dice) and information upload (e.g., from the dice to the test probe/ATE). An overview of various design schemes that may be implemented in embodiments of the present invention for downloading and uploading information is described hereafter. For instance, various examples of different dice interconnection schemes that may be used for downloading and uploading test data to/from dice are described in conjunction with FIGS. 4-8 hereafter. Many of the example interconnection schemes provided herein allow for increasing the wafer-level concurrency in testing multiple dice, thereby enabling a more efficient, reliable, and cost-effective test solution. Certain schemes may enable an increase in the silicon area utilized for implementing test circuitry per die (such as the implementation described in conjunction with FIG. 10). Further, the test schemes are preferably implemented with regularity at the wafer level.

In general, there are three ways of concurrently downloading data (e.g., from an ATE/probe) to multiple dice: 1) the corresponding inputs of the dice can be interconnected, and this approach is defined herein as Input Broadcasting ("IB"); 2) the input signals can be supplied to the dice using a pipeline that is placed on the die, referred to herein as Input Pipeline Die ("IPD"); and 3) the input signals can be supplied to the dice using a pipeline that is off the die, referred to herein as Input Pipeline Off Die ("IPOD").

Also, the output of dice signals (e.g., responsive to input test data) may be configured in a variety of different ways. For instance, the output signals from different dice can be concurrently tested by using a comparator (e.g., implemented in each die) in combination with interconnections between the corresponding pads, and such approach is referred to herein as Output Broadcasting Comparator ("OBC"). The output signals can also be concurrently downloaded using a pipeline.

The pipeline may be placed on the die, and such approach is referred to herein as Output Pipeline Die ("OPD"), or the pipeline may be placed off the die, which is referred to herein as Output Pipeline Off Die ("OPOD"). Using a signature analyzer, the output can be compressed. The resulting signature can again be communicated concurrently using the broadcasting comparator, and such approach is referred to herein as Output Signature Broadcasting Comparator ("OSBC"). Another way of communicating the signature is using a pipeline, which is referred to herein as Output Signature Pipeline ("OSP").

Table 1 gives an overview of the input/output communication schemes that are recommended for implementation of embodiments of the present invention based on such design criteria as providing concurrent testing of multiple dice in a reliable and efficient manner. The schemes having a "Yes" in Table 1 are recommended as providing preferred implementations and those having a "No" are not recommended (although, the non-recommended implementations are not intended to be precluded from the present invention).

course, wafer 20-1 may comprise many more than two dice, but only two are shown for simplicity. Die A comprises circuitry (e.g., it includes one or more logic circuits or CUTs) to be tested, shown in this example as logic 40A, and die B likewise comprises circuitry (or CUTs) to be tested, shown in this example as logic 40B.

Wafer-level access pads 24-1A and 24-1B are included on wafer 20-1, which may be contacted by probe pins 25-1 of probe card 43-1 in order to download information from ATE 26 to dice A and B and to upload information from dice A and B to ATE 26. More specifically, in this example, input test data may be downloaded from ATE 26 to access pads 24-1A, and output data from dice A and B (responsive to such input test data) may be output to access pad 24-1B. Although wafer-level access pads 24-1A and 24-1B are shown in this example as being arranged on wafer 20-1 external to dice A and B, in certain implementations, such access pads 24-1A and/or 24-1B may be implemented as access pads of a die. For instance, access pads 24-1A and/or 24-1B may be implemented in die A, and interconnection system 23-1 may be

TABLE 1

| | Output | | | | |
|---|---|---|---|---|---|
| Input | Broadcasting using a Comparator (OBC) | Pipeline Off the Die (OPOD) | Pipeline On the Die (OPD) | Signature with Broadcasting using a Comparator (OSBC) | Signature with Pipeline (OSP) |
| Broadcasting (IB) | Yes (IB/OBC) | No | No | Yes (IB/OSBC) | Yes (IB/OSP) |
| Pipeline Off The Die (IPOD) | No | Yes (IPOD/OPOD) | Yes (IPOD/OPD) | Yes (IPOD/OSBC) | Yes (IPOD/OSP) |
| Pipeline On The Die (IPD) | No | Yes (IPD/OPOD) | Yes (PID/OPD) | Yes (IPD/OSBC) | Yes (IPD/OSP) |

In implementing each of the above communication schemes, the number of dice that are communicatively interconnected, also called "section size," is generally limited. Moreover, the ratio of the total number of available die pads on the die (or input/output interfaces required for test) versus the number of such die pads (or input/output interfaces required for test) that can be interconnected (i.e. the interconnection ratio), will likely be less than 100%. Accordingly, scheduling considerations for situations in which a test scheme does not provide 100% interconnection between die pads are discussed herein below in conjunction with FIGS. 12 and 13. In general, the interconnection ratio may be less than 100% because of limitations in the available area. The number of communicatively interconnected dice (i.e., the section size) is limited by defects during the manufacturing process. Design for yield and fault tolerance techniques (e.g., redundancy of interconnection wires) can be used to increase the section size. Because these techniques typically require more silicon area, the interconnection ratio might decrease. Hence, there is generally a tradeoff to be made between the interconnection ratio and the section size.

Figure 4:
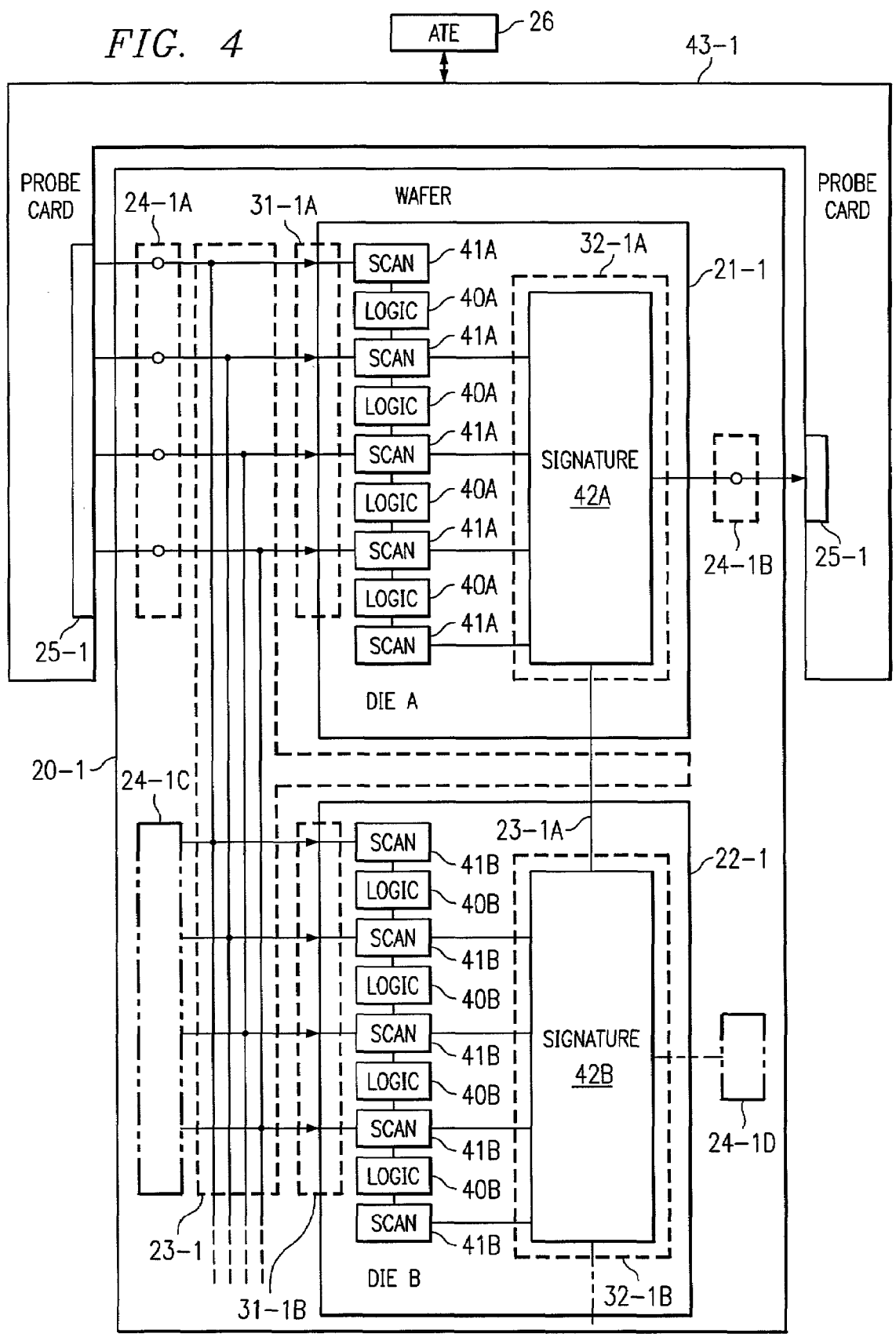
FIG. 4 shows an example of implementing an Input Broadcasting (IB) and Output Signature Pipeline (OSP) communication scheme for testing dice in accordance with an embodiment of the present invention.

FIG. 4 shows an example of implementing an Input Broadcasting (IB) and Output Signature Pipeline (OSP) communication scheme for testing dice. It should be understood that FIG. 4 is an illustrative block diagram, and the various components therein are not shown to scale. In this first example implementation of a communication scheme, wafer 20-1 comprises die A (labeled 21-1) and die B (labeled 22-1). Of utilized to interconnect such access pads of die A to die B in the manner described below. Moreover, access pads 24-1A and 24-1B, as well as interconnection system 23-1, may be implemented on the die or the wafer using only unused metal layers or using both unused metal layers and used metal layers in the fabrication process.

The example test scheme of FIG. 4 may be implemented as a repeatable pattern at the reticle level. For instance, even if the reticle comprises a single die, it may be implemented as a repeatable pattern. As shown in phantom line in FIG. 4, access pads 24-1A and/or 24-1B may be duplicated for die B as access pads 24-1C and 24-1D, respectively. As described below, such access pads 24-1C and 24-1D may not actually be used for communicating test data, but may instead be provided solely to maintain regularity at the wafer level. Of course, in other implementations a reticle may define a pattern for any number of dice, and the test scheme may be implemented such that a repeatable pattern is provided for such reticle.

In the example of FIG. 4, dice A and B are communicatively interconnected by interconnection system 23-1. Interconnection system 23-1 enables input test data from access pads 24-1A to be communicated concurrently (e.g., in parallel) to each of dice A and B. More specifically, interconnection system 23-1 implements an Input Broadcasting (IB) communication scheme in which input test data is broadcast from access pads 24-1A to each of dice A and B concurrently. To maintain signal integrity, impedance matching methods may be applied.

In the example of FIG. 4, a communication protocol system 31-1A and 31-1B is implemented for dice A and B, respectively. This provides a relatively simple example of a protocol that may be utilized in the interconnection of dice A and B, which is a one-to-one connection. That is, the communication protocol 311-1A and 31-1B provide identical connections from each of access pads 24-1A to each of dice A and B. For example, conductive traces may be provided that couple each of access pads 24-1A to common inputs of dice A and B in the manner shown in FIG. 4. This type of parallel input of test data to multiple dice is much like that proposed in prior art parallel testing schemes, such as shown in the examples of FIGS. 1B and 1C, and any such communication scheme enabling input of test data to be broadcast to dice A and B in parallel may be implemented.

In the example of FIG. 4, dice A and B are interconnected in a manner that enables output data from one of such dice (e.g., die B) to be communicated to the other (e.g., die A). More specifically, an Output Signature Pipeline (OSP) communication scheme is used for communicating the output of dice A and B to pad 24-1B responsive to the input data presented to such dice, wherein output data of die B is communicated to die A, which in turn provides such output data to pad 24-1B. In the example of FIG. 4, dice A and B comprise data processing systems 32-1A and 32-1B, which are operable to compress the output signals of their respective die using a signature analyzer 42A and 42B, respectively, such as well-known Multiple Input Signature Register (MISR). After the test of a die (i.e., once a die has generated output data responsive to the input test data), the signature analyzer of such die (or CUT) is reconfigured as a scan chain. The scan chain of a die is connected with other dice to make one wafer-level or wafer-section-level scan chain. For instance, dice A and B are interconnected via communication path 23-1A shown in the example of FIG. 4. Accordingly, the output data for dice A and B may be scanned out in a pipeline fashion by probe pin(s) 25-1 through access pads 24-1B to ATE 26, and such ATE 26 may evaluate each output received for the dice in turn to detect whether each die is functioning properly.

In view of the above, dice A and B may be tested concurrently. Further, the test scheme does not require that probe card 43-1 be moved and re-applied to different access pads in order to test the different dice A and B. Rather, access pads 24-1A may be used to input test data for testing both dice A and B concurrently, and pad(s) 24-1B may be used to receive output test data from the dice. Thus, the number of dice that may be tested concurrently is not limited by the probe card's configuration (e.g., the number of pins of the probe card). Instead, interconnection scheme 23-1 enables a plurality of dice to be concurrently tested with a probe card configuration that would otherwise be incapable of testing such plurality of dice concurrently. Also, the test scheme may be implemented in a manner that maintains a repeatable pattern at the reticle level. For example, even if the reticle comprises a single die, the scheme may be implemented to maintain a repeatable pattern for the reticle. It should be noted that certain portions of the test scheme that is duplicated for each die may be unused in actual testing. It should be recognized that having dice 21-1 and 22-1 communicatively interconnected may aid in maintaining such regularity at the wafer level. If not all input/output (I/O) interfaces of the CUTs can be interconnected, more advanced scheduling circuitry may be utilized, as described in FIGS. 12 and 13. For instance, the interconnection scheme may enable one die to be partially tested simultaneous with full testing of another die. While the probe card may need to be moved to complete the partially tested die, the overall wafer test time will be reduced below that required for the sequential testing techniques of the prior art.

Figure 5:
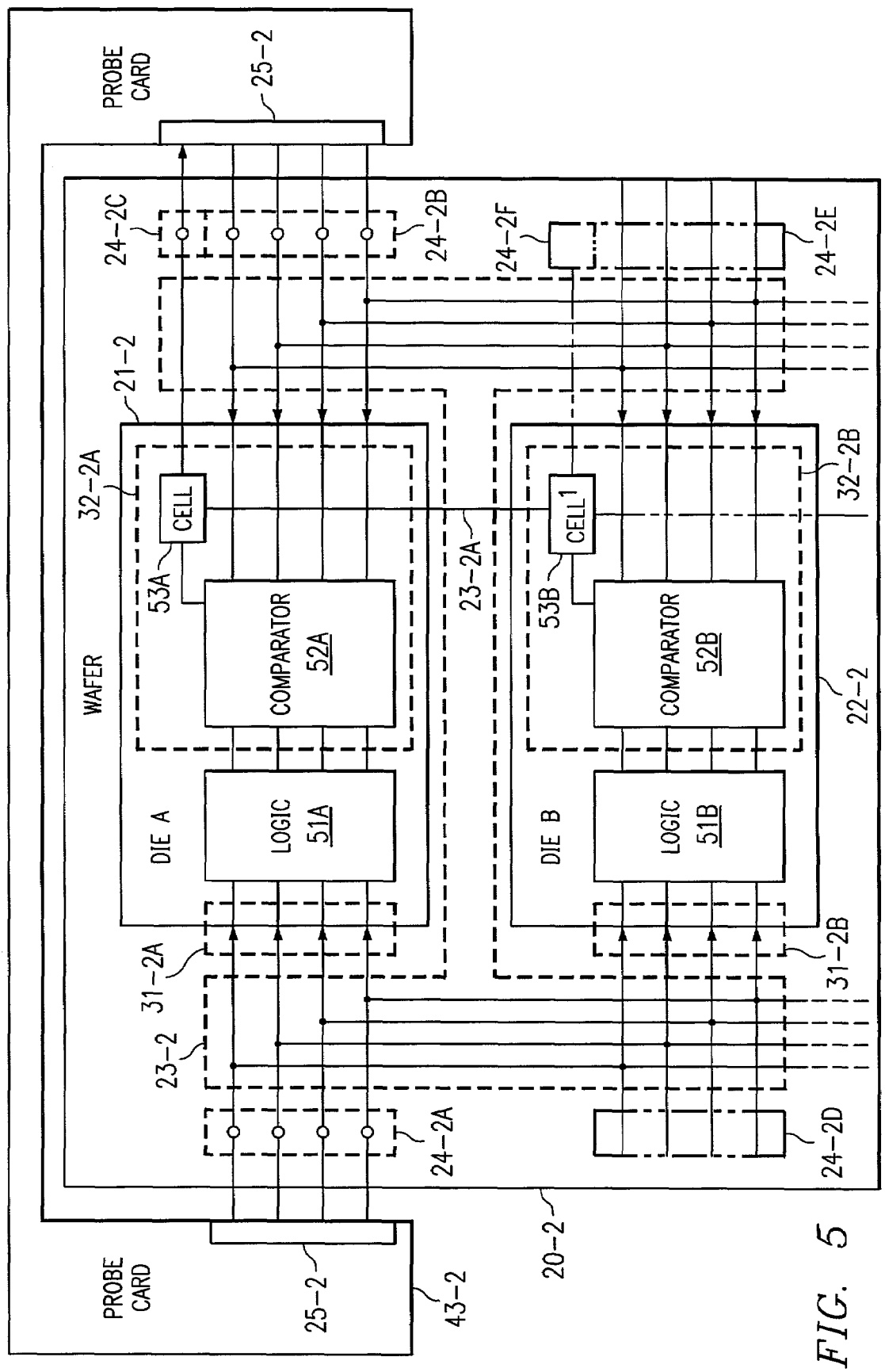
FIG. 5 shows an example of implementing an Input Broadcasting (IB) and Output Broadcasting Comparator (OBC) communication scheme for testing dice in accordance with an embodiment of the present invention.

FIG. 5 shows an example of implementing an Input Broadcasting (IB) and Output Broadcasting Comparator (OBC) communication scheme for testing dice. It should be understood that FIG. 5 is an illustrative block diagram, and the various components therein are not shown to scale. In this second example implementation of a communication scheme, wafer 20-2 again comprises die A (labeled 21-2) and die B (labeled 22-2). Of course, wafer 20-2 may comprise many more than two dice, but only two are shown for simplicity. Die A comprises circuitry (or CUT) to be tested, shown in this example as logic 51A, and die B likewise comprises circuitry (or CUT) to be tested, shown in this example as logic 51B.

Wafer-level access pads 24-2A, 24-2B, and 24-2C are included on wafer 20-2, which may be contacted by probe pins 25-2 of probe card 43-2 in order to download information from an ATE (not shown) to dice A and B and to upload information from dice A and B to such ATE. More specifically, in this example, input test data may be downloaded from an ATE to access pads 24-2A and 24-2B, and output data from dice A and B (responsive to such input test data) may be output to access pad(s) 24-2C. Although wafer-level access pads 24-2A, 24-2B, and 24-2C are shown in this example as being arranged on wafer 20-2 external to dice A and B, in certain implementations such access pads 24-2A, 24-2B, and/or 24-2C may be implemented as access pads of a die. For instance, access pads 24-2A, 24-2B, and/or 24-2D may be implemented in die A, and interconnection system 23-2 may be utilized to interconnect such access pads of die A to die B in the manner described below.

The example test scheme of FIG. 5 may be implemented as a repeatable pattern at the reticle level. For instance, even if the reticle comprises a single die, it may be implemented as a repeatable pattern. As shown in phantom line in FIG. 5, access pads 24-2A, 24-2B, and 24-2C may be duplicated for die B as access pads 24-2D, 24-2E, and 24-2F, respectively. As described below, such access pads 24-2D, 24-2E, and 24-2F may not actually be used for communicating test data, but may instead be provided solely to maintain regularity at the wafer level. Of course, in other implementations a reticle may define a pattern for any number of dice, and the test scheme may be implemented such that a repeatable pattern is provided for such reticle.

In this example, dice A and B are communicatively interconnected by interconnection system 23-2. Interconnection system 23-2 enables input test data from access pads 24-2A to be communicated concurrently (in parallel) to each of dice A and B, in the same manner as in the example of FIG. 4 described above. More specifically, just as in the example of FIG. 4, interconnection system 23-2 implements an Input Broadcasting (IB) communication scheme in which input test data is broadcast from access pads 24-2A to each of dice A and B concurrently. To maintain signal integrity, impedance matching methods may be applied.

Further, in this example, expected result data is input to each of dice A and B via access pads 24-2B. That is, an ATE may generate the expected result that the circuitry of dice A and B (i.e., logic 51A and 51B) should output responsive to the input test data, and such expected result data is communicated through a test probe to access pads 24-2B. The expected result data is communicated concurrently from access pads 24-2B to each of dice A and B via interconnection system 23-2 in accordance with an Input Broadcasting (IB) communication scheme.

In the example of FIG. 5, a communication protocol system 31-2A and 31-2B is implemented for dice A and B, respectively. This provides a relatively simple example of a communication protocol, just as is implemented in the example of FIG. 4 described above, which is a one-to-one connection. This type of parallel input of test data to multiple dice implemented for the example of FIG. 5 is much like that proposed in prior art parallel testing schemes, such as shown in the examples of FIGS. 1B and 1C, and any such communication scheme enabling input of test data to be broadcast to dice A and B in parallel may be implemented. The same type of communication protocol 31-2A and 31-2B is also implemented for communicating the expected test result data from access pads 24-2B to dice A and B in this example.

In the example of FIG. 5, dice A and B are interconnected in a manner that enables output data from one of such dice (e.g., die B) to be communicated to the other (e.g., die A). For instance, dice A and B are interconnected via communication path 23-2A shown in the example of FIG. 5. More specifically, an Output Broadcasting Comparator (OBC) communication scheme is used for communicating the output of dice A and B to pad(s) 24-2C responsive to the input data presented to such dice, wherein output data (e.g., error data) of die B is communicated to die A, which in turn provides such output data (e.g., error data) to pad(s) 24-2C. In the example of FIG. 5, dice A and B comprise data processing systems 32-2A and 32-2B, respectively, which comprise comparators 52A and 52B and error cells (or registers) 53A and 53B. Comparators 52A and 52B compare the expected output data (received through pad(s) 24-2B) with the actual output of logic 51A and 51B, respectively. Error cell 53B designates whether a difference between the expected output and the actual output of logic 51B of die B is detected by comparator 52B, and error cell 53A designates whether a difference between the expected output and the actual output of logic 51A of die A is detected by comparator 52A. The error registers 53A and 53B are configured as a scan chain between dice A and B. The ATE equipment can read this scan chain via access pad(s) 24-2C after the test sequence is completed.

Accordingly, in operation of this example, input test data is communicated to dice A and B from access pads 24-2A. Further, the results expected to be output by the circuitry 51A and 51B responsive to the input test data are generated in the ATE, and such expected output data is communicated to each of dice A and B via access pads 24-2B. That is, the expected output data is broadcast through the interconnection system 23-2 from access pads 24-2B to each of dice A and B. The actual circuitry (logic) of each die generates an output responsive to the input test data, and the output is input to the die's comparator along with the expected output data received from the ATE. The comparator of each die outputs an indication of whether the output of the die's circuitry responsive to the input test data corresponds to the expected output data, and such indication is stored in a register. The registers of multiple dice are interconnected to form a scan chain such that the test results can be scanned out in a pipeline fashion to a test probe via access pad(s) 24-2C, and the ATE can identify the dice that have an error indicated in the scan chain output.

Figure 6:
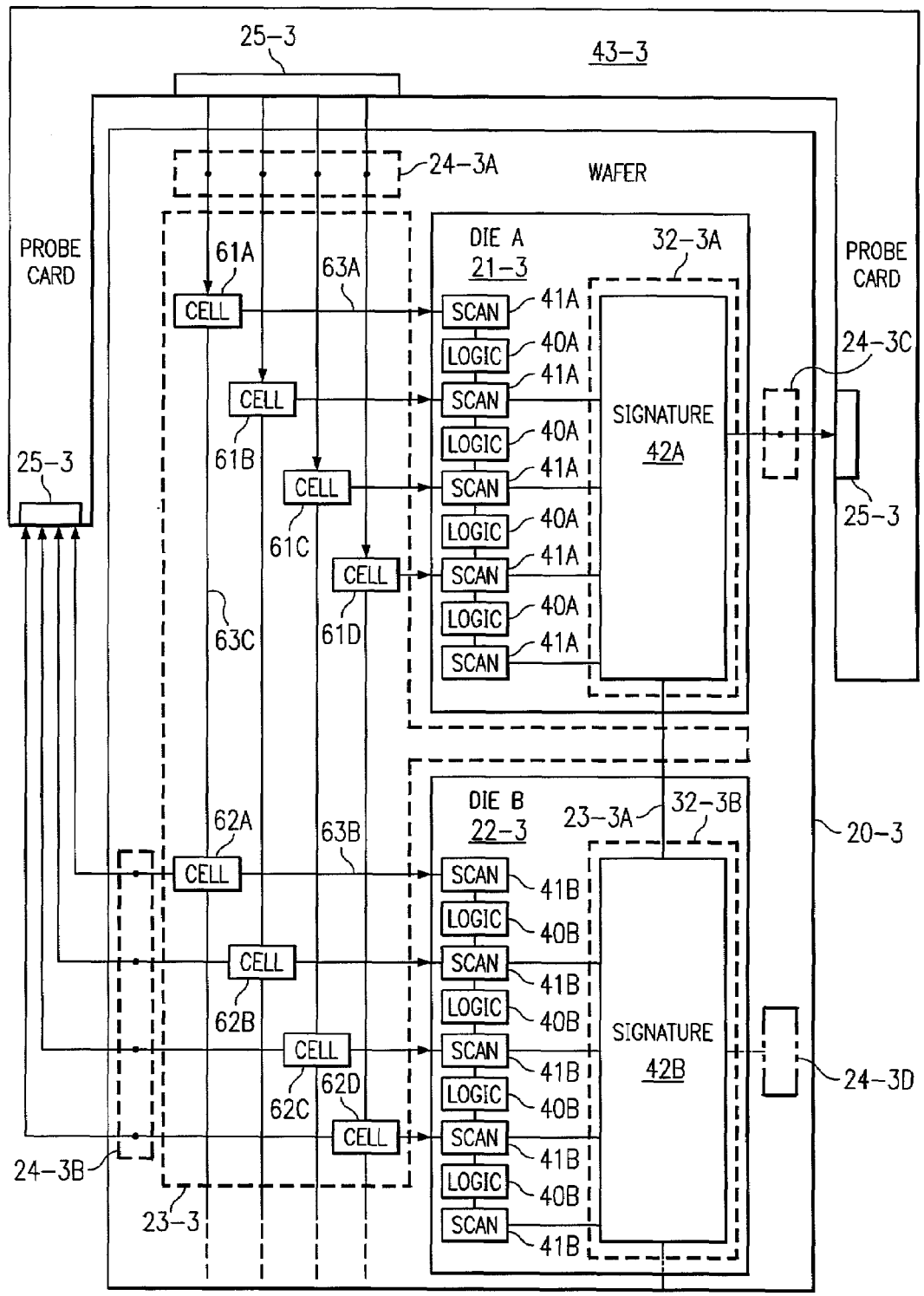
FIG. 6 shows an example of implementing an Input Pipeline Off Die (IPOD) and Output Signature Pipeline (OSP) communication scheme for testing dice in accordance with an embodiment of the present invention.

Turning now to FIG. 6, an example of implementing an Input Pipeline Off Die (IPOD) and Output Signature Pipeline (OSP) communication scheme for testing dice is shown. It should be understood that FIG. 6 is an illustrative block diagram, and the various components therein are not shown to scale. In this third example implementation of a communication scheme, wafer 20-3 comprises die A (labeled 21-3) and die B (labeled 22-3). Of course, wafer 20-3 may comprise many more than two dice, but only two are shown for simplicity. Die A comprises circuitry (or CUTs) to be tested, shown in this example as logic 40A, and die B likewise comprises circuitry (or CUTs) to be tested, shown in this example as logic 40B.

Wafer-level access pads 24-3A, 24-3B, and 24-3C are included on wafer 20-3, which may be contacted by probe pins 25-3 of probe card 43-3 in order to download information from an ATE (not shown) to dice A and B and to upload information from dice A and B to the ATE. More specifically, in this example, input test data may be downloaded from an ATE to access pads 24-3A, and output data from dice A and B (responsive to such input test data) may be output to access pad(s) 24-3C. Although wafer-level access pads 24-3A, 24-3B, and 24-3C are shown in this example as being arranged on wafer 20-3 external to dice A and B, in certain implementations, such access pads 24-3A, 24-3B, and/or 24-3C may be implemented as access pads of a die. For instance, access pads 24-3A, 24-3B, and/or 24-3C may be implemented in die A, and interconnection system 23-3 may be utilized to interconnect such access pads of die A to die B in the manner described below.

The example test scheme of FIG. 6 may be implemented as a repeatable pattern at the reticle level. For instance, even if the reticle comprises a single die, it may be implemented as a repeatable pattern. As shown in phantom line in FIG. 6, access pad 24-3C may be duplicated for die B as access pad 24-3D. As described below, such access pad 24-3D may not actually be used for communicating test data, but may instead be provided solely to maintain regularity at the wafer level. Of course, in other implementations a reticle may define a pattern for any number of dice, and the test scheme may be implemented such that a repeatable pattern is provided for such reticle.

In this example, dice A and B are communicatively interconnected by interconnection system 23-3. Interconnection system 23-3 enables input test data from access pads 24-3A to be communicated concurrently (in parallel) to each of dice A and B. More specifically, interconnection system 23-3 implements an Input Pipeline Off Die (IPOD) communication scheme in which input test data is communicated from access pads 24-3A to cells (or registers) 61A-61D (referred to collectively as cells 61) for input to die A, and input test data is communicated from cells 61A-61D to cells 62A-62D (referred to collectively as cells 62), respectively, for input to die B. Implementing such cells 61 and 62 in this manner prevents certain errors that may be encountered in implementing interconnection system 23-3 from propagating from one die to other interconnected dice. For example, suppose an error is present on input line 63A (e.g., such input line is shorted), this error will result in improper test data being input to die A. However, this error does not propagate to effect the input to die B. That is, cell 61A receives the correct input data and communicates it to cell 62A, which inputs such data via input line 63B to die B. Accordingly, the defect in input line 63A is not propagated to effect the input to die B via input line 63B. Because of this, the effective section size can increase.

Of course, if a defect were present with communication line 63C that interconnects cells 61A and 62A, then errors caused by such defect will propagate to die B (and any further dice interconnected through die B, i.e., any further dice that receive input from cell 62A). In this example implementation, the data of cells 62 is output to pads 24-3B and received by probe 43-3 such that an ATE can detect if any of cells 62 did not receive the proper input data. That is, an ATE can compare the expected input data with the actual input data received by cells 62. By detecting that a cell, such as cell 62A, did not receive the proper input data, it may be determined that a defect exists in the interconnection system 23-3 (e.g., a defect with communication line 63C).

Additionally, cells 61 and 62 may be utilized as a buffer, such as a First In, First Out (FIFO) buffer, for queuing up input data for dice A and B. Accordingly, while test circuitry is executing on dice A and B to test their respective logic and output test results to access pad 24-3C, probe pins 25-3 may be utilized to queue up the next test data for dice A and B in cells 61 and 62. Thereafter, when the dice are ready to receive new test data, such data is readily available in cells 61 and 62 and may be efficiently provided to the dice. Thus, the test data may be buffered to cells 61 and 62, and such cells may be used to satisfy bursts of input of test data to the dice. To support this goal, additional cells like cells 61 and 62 may be implemented in a similar manner.

As with the example of FIG. 4, in the example of FIG. 6, dice A and B are interconnected in a manner that enables output data from one of such dice (e.g., die B) to be communicated to the other (e.g., die A). More specifically, an Output Signature Pipeline (OSP) communication scheme is used for communicating the output of dice A and B to pad(s) 24-3C responsive to the input data presented to such dice, wherein output data of die B is communicated to die A, which in turn provides such output data to pad(s) 24-3C. In the example of FIG. 6, dice A and B comprise data processing systems 32-3A and 32-3B, respectively, which are operable to compress the output signals of their respective die using a signature analyzer 42A and 42B, respectively, such as MISR. After the test of a die (i.e., once a die has generated output data responsive to the input test data), the signature analyzer of such die is reconfigured as a scan chain. The scan chain is connected with other dice to make one wafer-level or wafer-section-level scan chain. For instance, dice A and B are interconnected via communication path 23-3A shown in the example of FIG. 6. Accordingly, the output data for dice A and B may be scanned out in a pipeline fashion by probe pin(s) 25-3 through access pad(s) 24-3C to an ATE, and such ATE may evaluate each output received for the dice in turn to detect whether each die is functioning properly.

Figure 7:
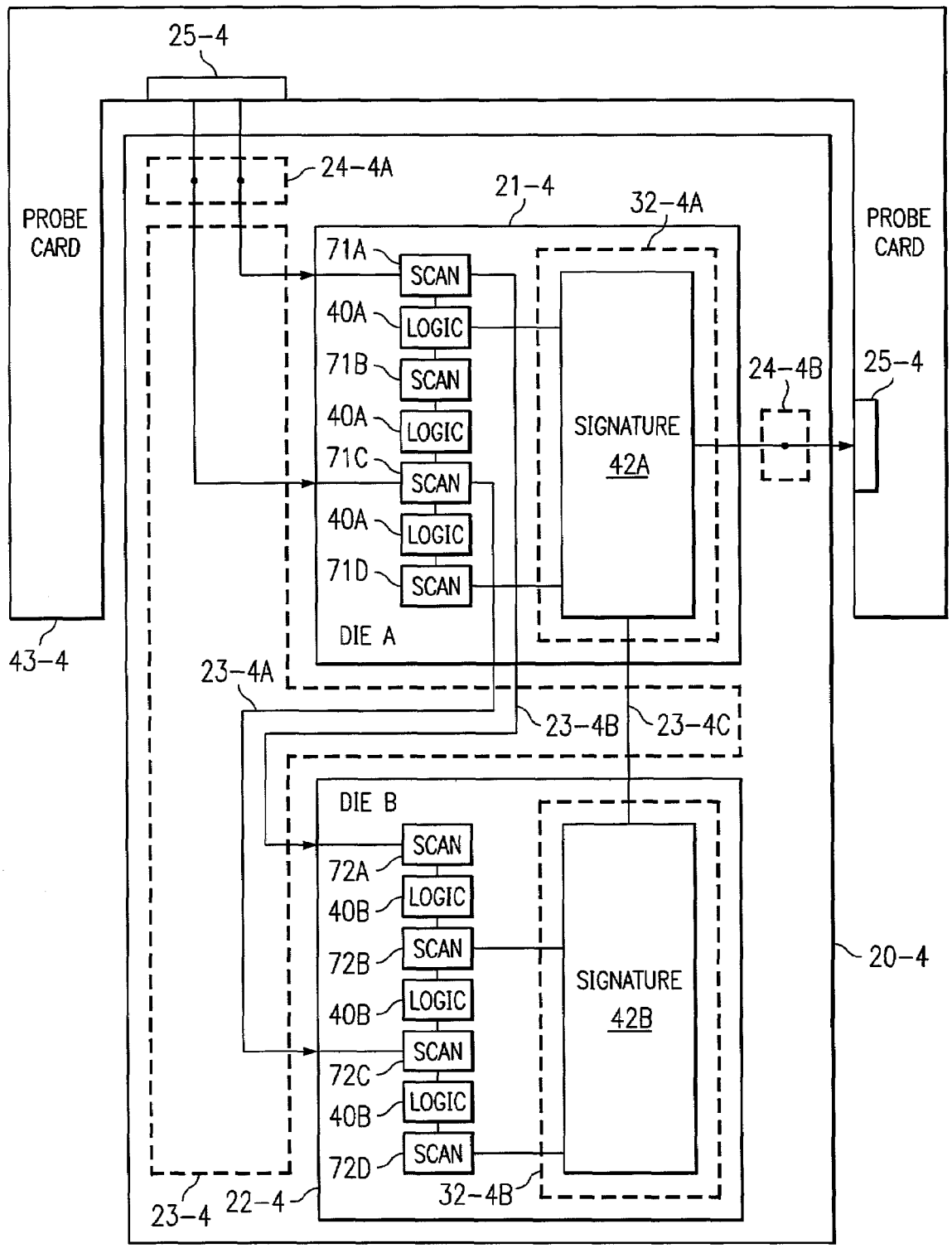
FIG. 7 shows an example of implementing an Input Pipeline Die (IPD) and Output Signature Pipeline (OSP) communication scheme for testing dice in accordance with an embodiment of the present invention.

FIG. 7 shows an example of implementing an Input Pipeline Die (IPD) and Output Signature Pipeline (OSP) communication scheme for testing dice. It should be understood that FIG. 7 is an illustrative block diagram, and the various components therein are not shown to scale. In this fourth example implementation of a communication scheme, wafer 20-4 comprises die A (labeled 21-4) and die B (labeled 22-4). Of course, wafer 20-4 may comprise many more than two dice, but only two are shown for simplicity. Die A comprises circuitry to be tested (or CUT), shown in this example as logic 40A, and die B likewise comprises circuitry to be tested (or CUT), shown in this example as logic 40B.

Wafer-level access pads 24-4A and 24-4B are included on wafer 20-4, which may be contacted by probe pins 25-4 of probe card 43-4 in order to download information from an ATE (not shown) to dice A and B and to upload information from dice A and B to the ATE. More specifically, in this example, input test data may be downloaded from an ATE to access pads 24-4A, and output data from dice A and B (responsive to such input test data) may be output to access pad(s) 24-4B. Although wafer-level access pads 24-4A and 24-4B are shown in this example as being arranged on wafer 20-4 external to dice A and B, in certain implementations, such access pads 24-4A and/or 24-4B may be implemented as access pads of a die (or dice). For instance, access pads 24-4A and 24-4B may be implemented in die A, and interconnection system 23-4 may be utilized to interconnect such access pads of die A to die B in the manner described below.

The example test scheme of FIG. 7 may be implemented as a repeatable pattern at the reticle level. For instance, even if the reticle comprises a single die, it may be implemented as a repeatable pattern. For instance, access pads 24-4A and 24-4B may be duplicated for die B in certain implementations (not shown in FIG. 7). As described below, such duplicated access pads may not actually be used for communicating test data, but may instead be provided solely to maintain regularity at the wafer level. Of course, in other implementations a reticle may define a pattern for any number of dice, and the test scheme may be implemented such that a repeatable pattern is provided for such reticle.

In this example, dice A and B are communicatively interconnected by interconnection system 23-4. Interconnection system 23-4 enables input test data from access pads 24-4A to be communicated to each of dice A and B. More specifically, interconnection system 23-4 implements an Input Pipeline Die (IPD) communication scheme in which input test data is communicated from access pads 24-4A to die A, and die A, in turn, communicates such input test data to die B (e.g., via interconnecting communication lines 23-4A and 23-4B). In this example, input scan chains are implemented on each die for communicating input data from one die to another. For instance, scan cells 71A and 71C of die A implement an input scan chain, which receives input test data from access pads 24-4A and communicates such input test data to scan cells 72A and 72C, respectively, of die B.

As with the example of FIG. 4, in the example of FIG. 7, dice A and B are interconnected in a manner that enables output data from one of such dice (e.g., die B) to be communicated to the other (e.g., die A). More specifically, an Output Signature Pipeline (OSP) communication scheme is used for communicating the output of dice A and B to pad(s) 24-4B responsive to the input data presented to such dice, wherein output data of die B is communicated to die A, which in turn provides such output data to pad(s) 24-4B. In the example of FIG. 7, dice A and B comprise data processing systems 32-4A and 32-4B, respectively, which are operable to compress the output signals of their respective die using a signature analyzer 42A and 42B, respectively, such as MISR.

After the test of a die (i.e., once a die has generated output data responsive to the input test data), the signature analyzer of such die is reconfigured as an output scan chain. This scan chain is connected with the similar scan chain of other dice to make one wafer-level or wafer-section-level scan chain. For instance, dice A and B are interconnected via communication path 23-4C shown in the example of FIG. 7. Accordingly, the output data for dice A and B may be scanned out in a pipeline fashion by probe pin(s) 25-4 through access pad(s) 24-4B to an ATE, and such ATE may evaluate each output received for the dice in turn to detect whether each die is functioning properly.

Figure 8:
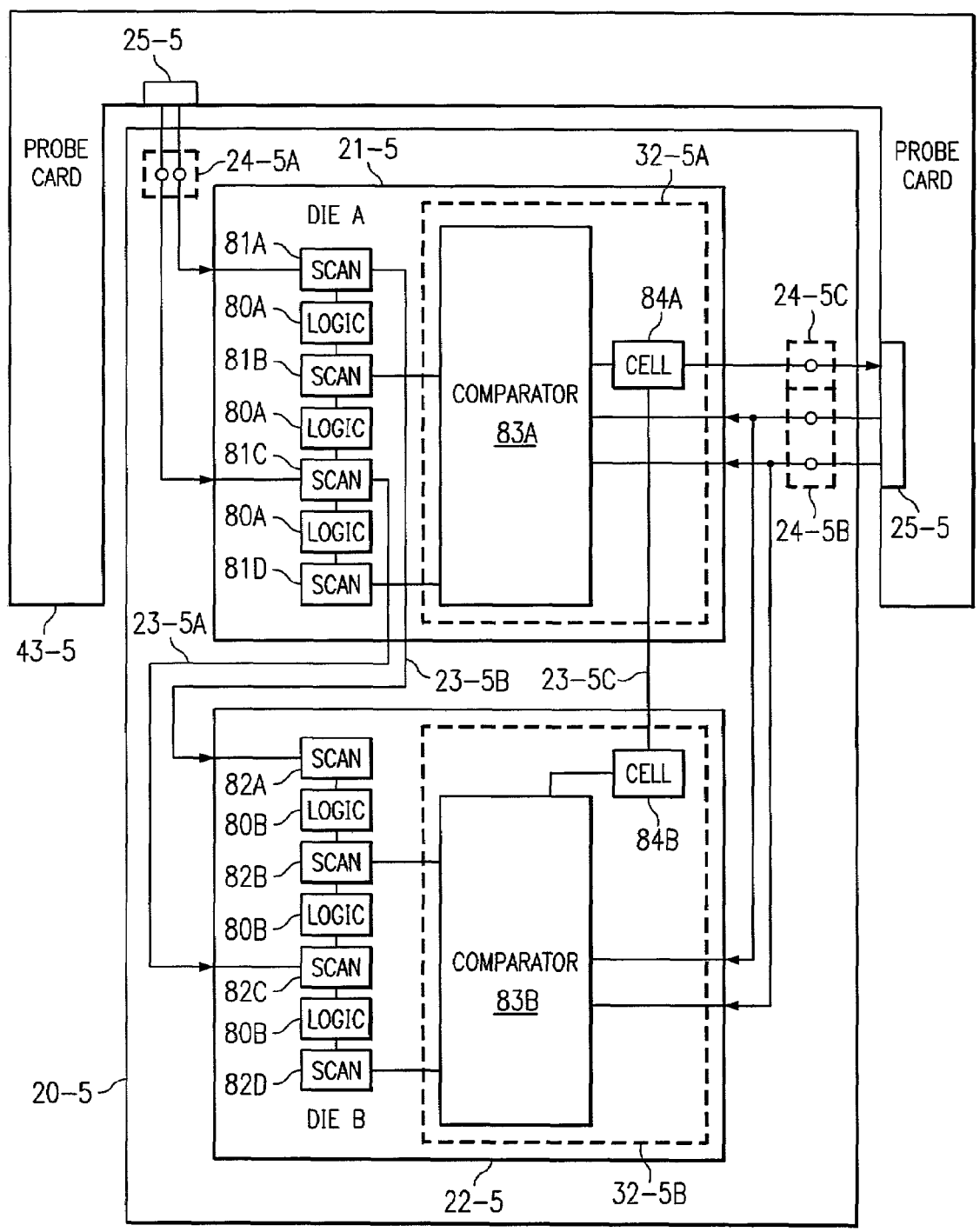
FIG. 8 shows an example of implementing an Input Pipeline Die (IPD) and Output Broadcasting Comparator (OBC) communication scheme for testing dice in accordance with an embodiment of the present invention.

FIG. 8 shows an example of implementing an Input Pipeline Die (IPD) and Output Broadcasting Comparator (OBC) communication scheme for testing dice. In this fifth example implementation of a communication scheme, wafer 20-5 comprises die A (labeled 21-5) and die B (labeled 22-5). Of course, wafer 20-5 may comprise many more than two dice, but only two are shown for simplicity. Die A comprises circuitry (or CUT) to be tested, shown in this example as logic 80A, and die B likewise comprises circuitry (or CUT) to be tested, shown in this example as logic 80B.

Wafer-level access pads 24-5A, 24-5B, and 24-5C are included on wafer 20-5, which may be contacted by probe pins 25-5 of probe card 43-5 in order to download information from an ATE (not shown) to dice A and B and to upload information from dice A and B to the ATE. More specifically, in this example, input test data may be downloaded from an ATE to access pads 24-5A, and output data from dice A and B (responsive to such input test data) may be output to access pad(s) 24-5C. Although wafer-level access pads 24-5A, 24-5B, and 24-5C are shown in this example as being arranged on wafer 20-5 external to dice A and B, in certain implementations, such access pads 24-5A, 24-5B, and/or 24-SC may be implemented as access pads of a die (or dice). For instance, access pads 24-SA may be implemented in die A, and interconnection system (comprising interconnections 23-5A, 23-5B, and 23-5C) may be utilized to interconnect such access pads of die A to die B in the manner described below. Moreover, all subsystems as introduced in FIG. 3 above, may be placed on the die, off the die, or both on the die and off the die.

The example test scheme of FIG. 8 may be implemented as a repeatable pattern at the reticle level. For instance, even if the reticle comprises a single die, it may be implemented as a repeatable pattern. For instance, access pads 24-5A, 24-5B, and 24-5C may be duplicated for die B in certain implementations (not shown in FIG. 8). As described below, such duplicated access pads may not actually be used for communicating test data, but may instead be provided solely to maintain regularity at the wafer level. Of course, in other implementations a reticle may define a pattern for any number of dice, and the test scheme may be implemented such that a repeatable pattern is provided for such reticle.

In this example, dice A and B are communicatively interconnected by an interconnection system. The interconnection system enables input test data from access pads 24-5A to be communicated to each of dice A and B. More specifically, such interconnection system implements an Input Pipeline Die (IPD) communication scheme in which input test data is communicated from access pads 24-5A to die A, and die A, in turn, communicates such input test data to die B (e.g., via interconnecting communication lines 23-5A and 23-5B). In this example, as in the example of FIG. 7, input scan chains are implemented on each die for communicating input data from one die to another. For instance, scan cells 81A and 81C of die A implement an input scan chain, which receives input test data from access pads 24-5A and communicates such input test data to scan cells 82A and 82C, respectively, of die B.

Further, in this example, expected result data is input to each of dice A and B via access pads 24-5B. That is, an ATE may generate the expected result that the circuitry of dice A and B (i.e., logic 80A and 80B) should output responsive to the input test data, and such expected result data is communicated through a test probe to access pads 24-5B. The expected result data is communicated concurrently from access pads 24-5B to each of dice A and B via the interconnection system in accordance with an Input Broadcasting (IB) communication scheme, as in the example of FIG. 5 described above.

As in the example of FIG. 5, in this example, dice A and B are interconnected in a manner that enables output data from one of such dice (e.g., die B) to be communicated to the other (e.g., die A). More specifically, an Output Broadcasting Comparator (OBC) communication scheme is used for communicating the output of dice A and B to pad(s) 24-5C responsive to the input data presented to such dice, wherein output data of die B is communicated to die A, which in turn provides such output data to pad(s) 24-5C. In the example of FIG. 8, dice A and B comprise data processing systems 32-5A and 32-5B, respectively, which comprise comparators 83A and 83B and error cells (or registers) 84A and 84B. Comparators 83A and 83B compare the expected output data (received through pad(s) 24-5B) with the actual output of logic 80A and 80B, respectively. Error cell 84B designates whether a difference between the expected output and the actual output of logic 80B of die B is detected by comparator 83B during the test, and error cell 84A designates whether a difference between the expected output and the actual output of logic 80A of die A is detected by comparator 83A during the test. The error registers 84A and 84B are configured as a scan chain between dice A and B. The ATE equipment can read this scan chain via access pad(s) 24-5C after the test sequence is completed.

Accordingly, in operation of this example, input test data is communicated to dice A and B from access pads 24-5A. Further, the results expected to be output by the circuitry 51A and 51B responsive to the input test data are generated in the ATE, and such expected output data is communicated to each of dice A and B via access pads 24-5B. That is, the expected output data is broadcast through the interconnection system from access pads 24-5B to each of dice A and B. The actual circuitry (logic) of each die generates an output responsive to the input test data, and the output is input to the die's comparator along with the expected output data received from the ATE. The comparator of each die outputs an indication of whether the output of the die's circuitry responsive to the input test data corresponds to the expected output data, and such indication is stored in a register. The registers of multiple dice are interconnected to form a scan chain such that the test results can be scanned out in a pipeline fashion to a test probe via access pad(s) 24-5C, and the ATE can identify the dice that have an error indicated in the scan chain output.

Sample implementations of communication schemes that may be implemented in accordance with embodiments of the present invention are shown in FIGS. 4-8, it should be understood that the present invention is not intended to be limited solely to such example implementations. Rather, various other suitable communication schemes may be implemented that enable interconnection of a plurality of dice in accordance with the present invention. For example, various other communication schemes may be implemented to communicatively interconnect a plurality of dice such that test data (e.g., input test data and/or output test data) is communicated from one die to at least one other die. Additionally or alternatively, various other communication schemes may be implemented to communicatively interconnect a plurality of dice in a manner that enables concurrent testing of a plurality of the dice while maintaining a repeatable pattern at the reticle level.

The subsystems for implementing the dice testing schemes of embodiments of the present invention (e.g., access pads, interconnection system, communication protocol, and/or data processing system) may be arranged in a manner that makes efficient usage of wafer area. For example, embodiments of the present invention may be arranged on the area between dice and/or the area at the edge of a wafer. Such area(s) can be used at no additional silicon cost, since they are typically not used in the manufacturing process (i.e., the areas are unused white space). Additionally, test circuitry may be shared between dice. For instance, a portion of the test circuitry may be implemented on several different dice, and such several different dice may be interconnected to form the test circuitry to be utilized for testing such dice.

Figure 9:
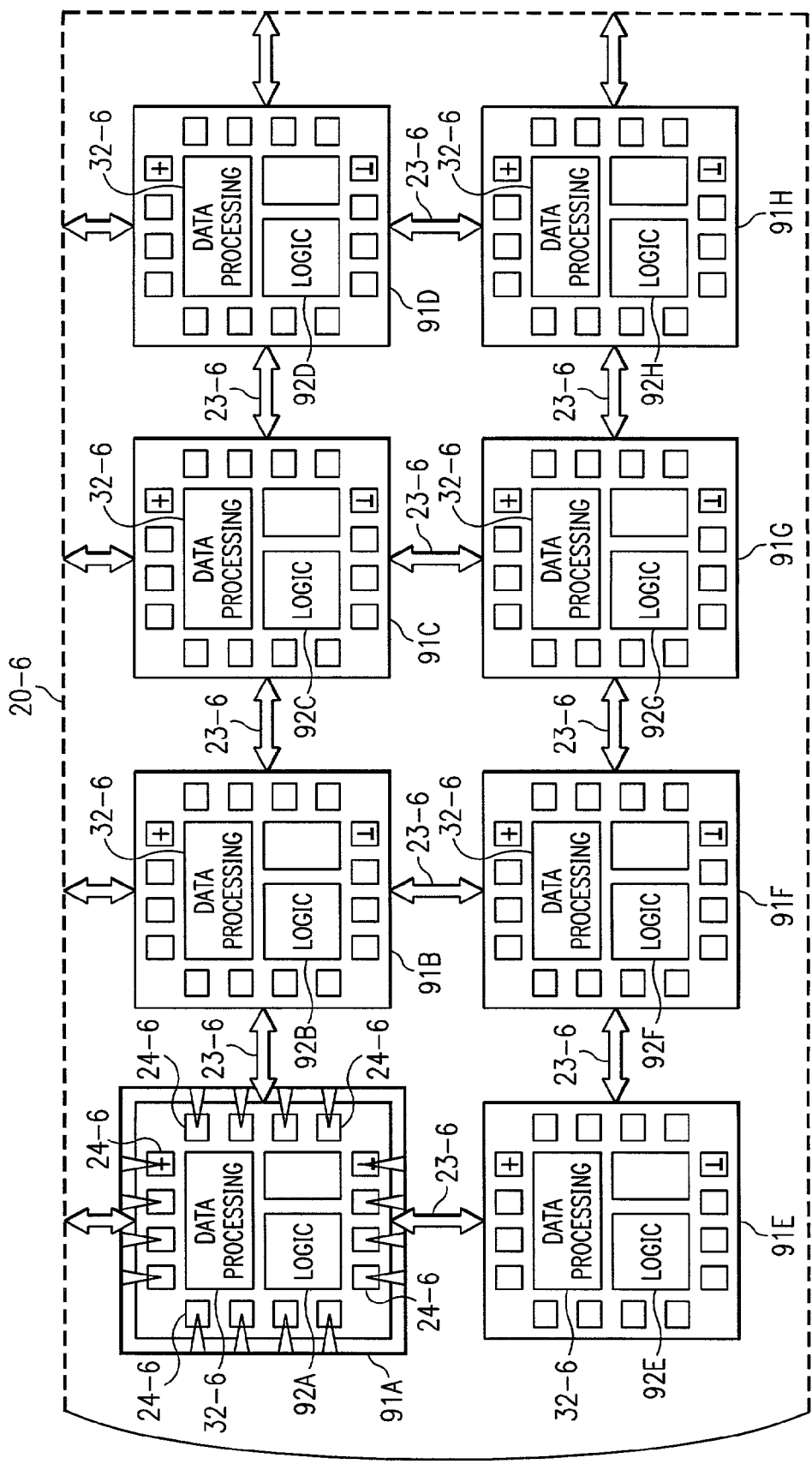
FIG. 9 shows an example of how the overall area of a wafer can be used for implementing a dice testing scheme in accordance with an embodiment of the present invention, wherein one die is probed and such probing a plurality of dice may be tested concurrently.

FIG. 9 illustrates an example of how the overall area of a wafer can be used for implementing a dice testing scheme in accordance with an embodiment of the present invention.

This example shows a section of a wafer 20-6 that comprises eight dice 91A-91H. Of course, wafer 20-6 may comprise more or less than eight dice, but eight are shown for illustrative purposes in this example. Access pads 24-6 are included on die 91A, which may be contacted by probe pins of a probe card (not shown) in order to download information from an ATE (not shown) to dice 91A-91H and to upload information from dice 91A-91H to the ATE. Each of dice 91A-91H may comprise logic, such as logic 92A-82H of dice 91A-91H, respectively. Further, one or more of dice 91A-91H may comprise data processing subsystem 32-6 of the die testing scheme, which may, for example, comprise a data processing system such as those described above.

In this example, dice 91A-91H are communicatively interconnected by interconnection system 23-6, which may, for example, comprise an interconnection scheme such as those described above. Accordingly, only die 91A is probed, and through probing die 91A, all eight dice 91A-91H may be tested concurrently. More specifically, interconnection system 23-6 may implement a communication scheme in which input test data is communicated from access pads 24-6 of die 91A to dice 91B-91H, and output test data is communicated from dice 91B-91H to die 91A (e.g., to be read out by a probe contacting pad(s) 24-6). Accordingly, in certain embodiments of the present invention, access pads of one die (e.g., die 91A) may be contacted by a probe in order to test multiple interconnected dice (e.g., dice 91A-91H).

Figure 10:
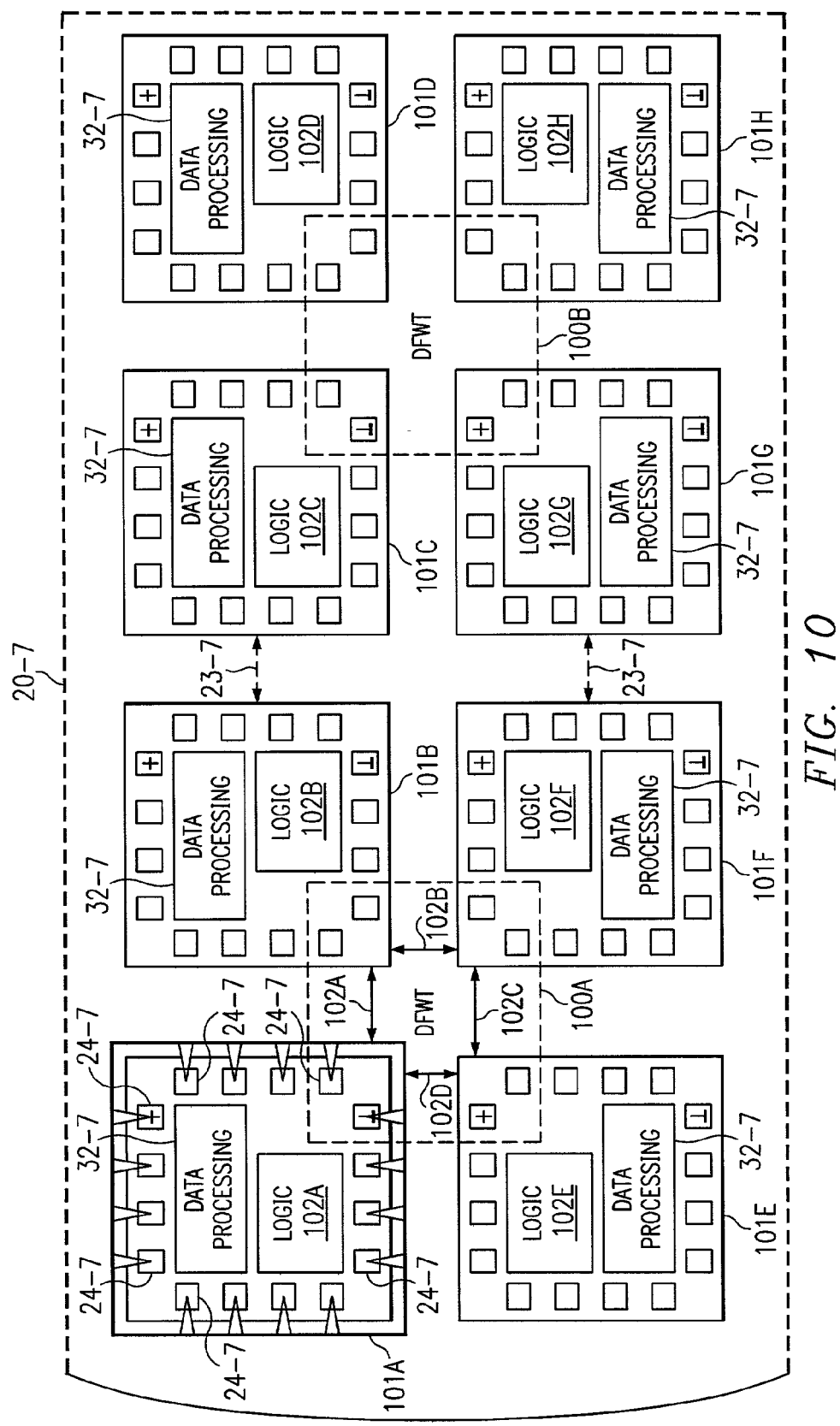
FIG. 10 shows an example of how the overall area of a wafer can be used for implementing a dice testing scheme in accordance with an embodiment of the present invention, wherein area for implementing a testing scheme is distributed among multiple dice.

FIG. 10 illustrates another example of how the overall area of a wafer can be used for implementing a dice testing scheme in accordance with an embodiment of the present invention. This example shows a section of a wafer 20-7 that comprises eight dice 101A-101H. Of course, wafer 20-7 may comprise more or less than eight dice, but eight are shown for illustrative purposes in this example. Access pads 24-7 are included on die 101A, which may be contacted by probe pins of a probe card (not shown) in order to download information from an ATE (not shown) to at least a portion of dice 101A-101H and to upload information from at least a portion of dice 101A-101H to the ATE. Each of dice 101A-101H may comprise logic, such as logic 102A-102H of dice 101A-101H, respectively. Further, one or more of dice 101A-101H may comprise data processing subsystem 32-7 of the die testing scheme, which may, for example, comprise a data processing system such as those described above.

This example illustrates how multiple dice can share a large silicon area to implement a testing scheme. For example, testing schemes 100A and 100B may be implemented, which may comprise a testing scheme (or "Design For Wafer Test" (DFWT)) of an embodiment of the present invention, such as any of the example testing schemes described above in conjunction with FIGS. 4-8. As shown, testing scheme 100A may utilize otherwise unused wafer area between dice 101A, 101B, 101E, and 101F. Further, testing scheme 100A may utilize a portion of each of dice 101A, 101B, 101E, and 101F. Thus, a portion of testing scheme 100A may be implemented on each of such dice, thereby minimizing the amount of space required in any one of the die for implementing such testing scheme 100A. Testing scheme 100B is implemented in a like manner utilizing otherwise unused wafer area between (and a portion of) dice 101C, 101D, 101G, and 101H.

The various subsystems that comprise the dice testing scheme to be implemented (e.g., the access pads, the dice interconnection system, the communication protocol, and the data processing system) may be implemented in area 100A, thus utilizing unused wafer space and a portion of multiple dice. For example, a portion of the data processing system 32-7 needed for testing dice 101A, 101B, 101E, and 101F may be implemented on each of such dice, as shown in FIG. 10. Alternatively or additionally, a portion of such data processing system may be implemented on unused area of wafer 20-7 (i.e., the area between dice 101A, 101B, 101E, and 101F).

An interconnection scheme may be implemented for communicating test data input to one of dice 101A, 101B, 101E, and 101F to the others of such dice for testing the dice, and such interconnection scheme may be implemented for communicating output test data from the dice 101A, 101B, 101E, and 101F to the appropriate access pads. For instance, communication lines 102A-102D are shown in the example of FIG. 10 for interconnecting dice 101A, 101B, 101E, and 101F. In operation of at least one embodiment, probe pins may be brought into contact with access pads 24-7 of die 101A, and input test data may be communicated to at least dice 101A, 101B, 101E, and 101F via such access pads through the interconnection system. Further, output test data may be communicated from dice 101A, 101B, 101E, and 101F to the appropriate access pads 24-7 of die 101A for output to a probe. Further, in certain implementations, interconnection scheme 23-7 may be provided to enable test data input to die 101A to be further communicated to dice 101C, 101D, 101G, and 101H for testing using test scheme 100B, and interconnection scheme 23-7 may also enable output test data from dice 101C, 101D, 101G, and 101H to be communicated to die 101A for output to a testing probe.

The example test scheme of FIG. 10 may be implemented as a repeatable pattern at the reticle level. For example, dice 101A, 101B, 101E, and 101F may comprise a reticle having a repeatable pattern. As another example, all of dice 101A-101H may comprise a reticle having a repeatable pattern. Of course, in other implementations a reticle may define a pattern for any number of dice, and the test scheme may be implemented such that a repeatable pattern is provided for such reticle. In this embodiment, a reticle preferably comprises the plurality of shared dice implementing a test scheme, such as dice 101A, 101B, 101E, and 101F implementing test scheme 100A.

Built-in Self Test (BIST) circuitry is commonly implemented on a die for testing the die. However, such BIST circuitry often consumes a large amount of area on each die. With this arrangement, such BIST circuitry may be implemented within the testing scheme 100A, for example, and may be shared between dice 101A, 101B, 101E, and 101F. That is, a fraction of the overall area required for a BIST may be consumed on a plurality of interconnected dice, thus implementing the overall BIST circuitry with less space required on each individual die. Accordingly, the amount of space required on any one of such dice for implementing the BIST may be minimized and/or a much larger BIST circuitry may be implemented. Currently, the required area is a significant limitation to BIST testing solutions, and embodiments of the present invention, such as that of FIG. 10, may enable more space-efficient implementations of BIST testing.

The relatively large area provided by each of testing schemes 100A and 100B can, for example, include Precision Measurement Unit (PMU) circuitries or an advance test generation circuitry, e.g. Microprocessor Unit (MPU), Field Programmable Gate Array (FPGA), or a dynamic wafer test management system. Many of such advanced test circuitry require a lot of area and therefore are not typically implemented on a die. However, the interconnected dice of this embodiment may enable a fraction of multiple different die areas to be used for implementing the test circuitry. It is clear to see that this approach can result in more than four times the original silicon area used for testing, at almost no additional cost. The area of each of testing schemes 100A and 100B can, for example, also be used for implementing a few large pads for high performance probes (i.e., high frequency and accuracy probes), as well as a de-multiplex circuitry to multiplex the high performance signal(s) from such probes to multiple dice that require a lower signal performance for testing purposes. In view of the above, this example testing scheme enables a larger testing system (which may therefore have increased functionality) for a die without incurring a large per die area penalty.

Figure 11:
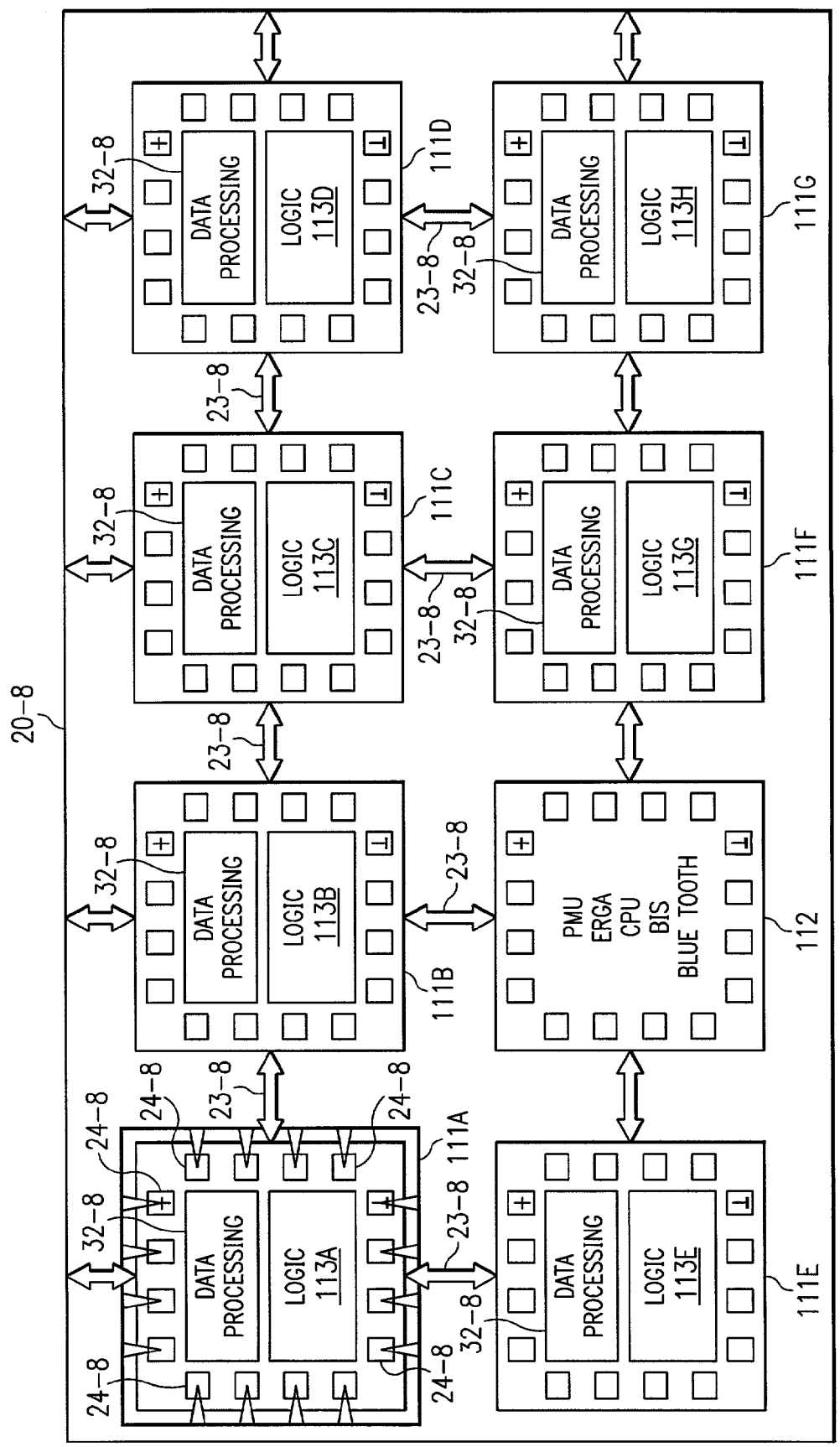
FIG. 11 shows another example of how the overall area of a wafer can be efficiently used for implementing a dice testing scheme in accordance with an embodiment of the present invention, wherein a dedicated testing die is utilized for testing a plurality of dice communicatively interconnected therewith.

FIG. 11 shows another example of how the overall area of a wafer can be efficiently used for implementing a dice testing scheme in accordance with an embodiment of the present invention. This example shows a section of a wafer 20-8 that comprises eight dice 111A-111G and 112. Of course, wafer 20-8 may comprise more or less than eight dice, but eight are shown for illustrative purposes in this example. Access pads 24-8 are included on die 111A, which may be contacted by probe pins of a probe card (not shown) in order to download information from an ATE (not shown) and to upload information to the ATE. Each of dice 111A-111G may comprise logic, such as logic 113A-113G, respectively.

A dedicated testing die 112 is also included, which is communicatively interconnected with dice 101A-111G. Such dedicated testing die 112 may comprise a central processing unit (CPU), PMU circuitries, an advance test generation circuitry (e.g. MPU, FPGA, etc.), a BIST, Blue Tooth communication module, and/or circuitry to support loopback tests, as examples. Thus, testing functionality may be implemented on a dedicated testing die 112 that is preferably in near proximity to the dice that it is utilized for testing, and the dice interconnection scheme 23-8 of the present invention may be utilized to enable such dedicated testing die 112 to be utilized for testing multiple other dice 111A-111G.

In operation of this example, probe pins may be brought into contact with access pads 24-8 of die 111A, and input test data may be communicated to dice 111A-111G and/or to testing die 112 via such access pads through the interconnection system 23-8. Further, output test data may be communicated from dice 111A-111G and/or testing die 112 to the appropriate access pads 24-8 of die 111A for output to a probe. In view of the above, this example testing scheme enables a relatively large testing circuitry to be implemented at a dedicated testing die 112 (which may therefore have increased functionality) without incurring a per die area penalty for the tested dice 111A-111G.

Implementing a wafer-level testing scheme in accordance with embodiments of the present invention to increase the wafer-level concurrency in testing multiple dice may provide an economic benefit to the manufacturing process. As described further below, under certain assumptions, the economic gain can be significant (e.g., 50×) in certain applications. The throughput gain due to testing multiple dice concurrently using an interconnection network in accordance with embodiments of the present invention is now analyzed.

In implementing a testing scheme that interconnects a plurality of dice and utilizing such testing scheme for maximum benefit, scheduling of test data is an important consideration. For example, it is generally desirable to schedule the communication of test data to the dice in a manner that utilizes resources (e.g., test probe) optimally. In some cases a dynamic wafer test management system (or dynamic scheduling system) may be implemented that monitors the testing of dice and dynamically schedules the input of test data to such dice. As an example, if after inputting a first set of test data to a die it is known that the die is defective, it may be desirable to utilize input resources in testing other dice, as opposed to continuing to test the known defective die.

The number of interconnections available between dice in the testing scheme may further affect the appropriate type of scheduling to implement. For instance, while the example schemes illustrated in FIGS. 4-8 above show 100% interconnections between dice (i.e., all test data input to a first die is also communicated to another die), in some implementations only a portion of the dice inputs may be interconnected. For example, one or more dice may receive all input test data and one or more other dice interconnected therewith may be interconnected so as to enable receipt of only 50% of the input test data. That is, while certain dice receive 100% of the test data (e.g., the die or dice that are directly connected to the probe card), certain other interconnected dice may concurrently receive 50% of the input test data.

Two specific types of implementations (i.e., one-time concurrent test scheme, and continuous concurrent test scheme) and their associated throughput gains are described below. It should be understood that this is only a subset of the possible applications of embodiments of the present invention. In addition, it should be noted that the calculated gains provided below are best-case scenarios (i.e. upper limits).

The throughput gain of using the Design For Wafer Test (DFWT) systems of embodiments of the present invention is the proportionality factor between the new wafer throughput $UPH_{DFWT}$ and the old wafer (i.e., wafer utilizing traditional testing methods, such as that of FIG. 1A) throughput $UPH_{OLD}$. The following equation calculates the gain due to reduction of the test time that may be recognized when implementing an embodiment of the present invention:

$$\text{gain} = \left(\frac{UPH_{DFWT}}{UPH_{OLD}} - 1\right) = \left(\frac{t_{WAFER\_OLD}}{t_{WAFER\_DFWT}} - 1\right)$$
$$= \left(\frac{P_{WAFER\_OLD}}{P_{WAFER\_DFWT}} - 1\right) = \left(\frac{m_{SECTION\_SIZE} \cdot P_{DIE\_OLD}}{P_{SECTION\_DFWT}} - 1\right).$$

The test time t is assumed to be proportional to the test vector volume p at the wafer level, the (wafer) section level and the die level. Moreover, the total wafer is assumed to include a number of wafer sections that require an average test volume of $p_{SECTION\_NEW}$. Each wafer section comprises an average of m dies. Each die requires an average vector volume of $P_{OLD}$ without design-for-wafer-testability.

One method that may be implemented for concurrently testing multiple dice of a wafer using embodiments of the present invention is a one-time concurrent test scheme. For example, if only 50% of the inputs can be made concurrent, then the first die will take the same number of vectors and all the parallel connected dies will only take 50% of these vectors. Using this simple scheme the following equation can be derived:

$$P_{SECTION\_NEW} = P_{DIE\_OLD} + (m-1)\frac{n-q}{n}P_{DIE\_OLD}.$$

In the above equation, q is the number of parallel connected wafer pads, n is the total number of wafer pads, and m is the section size (the minimum of the expected section size μ and the cluster size). Using this expression, the following throughput gain can be calculated:

$$\text{gain} = \left(\frac{m \cdot P_{\text{DIE\_OLD}}}{P_{\text{SECTION\_NEW}}} - 1\right) = \left(\frac{m}{(m-1)\left(1 - \frac{q}{n}\right) + 1} - 1\right) = \left(\frac{mn}{(m-1)(n-q) + n} - 1\right).$$

It should be recognized from the above equation that if the interconnection ratio (q/n) is too low, the throughput gain will be negligible independent of how large the section size (m) can be made. This becomes clear by defining the following saturation gain:

$$\text{gain}_{SAT} = \lim_{m \to \infty}(\text{gain}) = \frac{1}{\left(1 - \frac{q}{n}\right)} - 1.$$

If, for example, the interconnection ratio is only 30%, then the maximum throughput gain is 60%, no matter how large the section size m. This economic bottleneck points us to using the (inter)connection network optimally. This may be done by using the full bandwidth of all communication channels to and from the dice. In other words: (1) the channel from the tester to the die should preferably use all of the signals/pins (n) at the full frequency, and (2) the channel between the dies should preferably use all of the available interconnection lines (q) at the full frequency. In the above one-time concurrent test method, statement (2) holds only at the first tested die. The full bandwidth of the interconnection channel is not used for the remaining dice of the section m. This is not the case for the continuous concurrent test method described below.

With a continuous concurrent test method, if the first die is tested, the remaining dice in the section m are tested for q/n part. Consequently, if the second die is tested, only (1−q/n) of the data needs to be downloaded. When this data is downloaded using the continuous concurrent test scheme, the remaining dice in the section m will be tested for (q/n(1−q/n)) part. To get a good overview, it helps to make a matrix of the amount of information that is to be downloaded for each die in the section m versus the position of the probe. This is illustrated in table 2 below. For ease of description, the concurrency ratio α=q/n is substituted, and the downloaded number of vectors is described in units $p_{DIE\_OLD}$.

Because of the download structure, the pyramid of Pascal is going to occur. The bold numbers in the table designates this. Consequently, the sequence of numbers in one row is a subset of the Fabinacci series. Because of this, the result can easily be factored into factors with an increasing exponent (something that is intuitive and relatively easy to understand). To get the total download data for the section m, one has to sum the numbers at the diagonal of the matrix. This can easily be done using arithmetic progression. The resulting equation of this exercise is illustrated below:

$$P_{\text{SECTION\_NEW}} = \left(\frac{1 - \left(1 - \frac{q}{n}\right)^m}{\frac{q}{n}}\right) P_{\text{DIE\_OLD}};$$

$$\text{gain} = \left(\frac{m \cdot P_{\text{DIE\_OLD}}}{P_{\text{SECTION\_NEW}}} - 1\right) = \left(\frac{m\frac{q}{n}}{1 - \left(1 - \frac{q}{n}\right)^m} - 1\right) = \left(\frac{mq}{n - n\left(1 - \frac{q}{n}\right)^m} - 1\right).$$

From the above analysis, it should be recognized that no matter how long q is, if m gets high enough, it will result in an increasing throughput. This can also be illustrated by calculating the saturation gain:

$$\text{gain}_{SAT} = m \lim_{\substack{\to \infty \\ q\ln \neq 0}}(\text{gain}) = \left(\frac{m\frac{q}{n}}{1 - \left(1 - \frac{q}{n}\right)^m} - 1\right) \to \infty.$$

For example, if one managed only to make an interconnection ratio q/n of 1%, then it is still possible to get a gain of 900%, if the section size m is 1000. This is valuable because now we can tradeoff the interconnection ratio q/n with the expected section size m based on the statistical defect distribution in the interconnection.

The continuous concurrent test method is more complex to implement that the one-time concurrent test method. For instance, implementing the continuous concurrent test method generally requires complex multiplexing support. Consequently, it is valuable to know exactly if and when it is

TABLE 2

The download data for each die of a section of 6 dice.

| Probe at Die | \multicolumn{6}{c}{Download information to Die (in units $p_{DIE\_OLD}$)} | | | | | |
|---|---|---|---|---|---|---|
| | 1 | 2 | 3 | 4 | 5 | 6 |
| 1 | 1 | a | a | a | A | a |
| 2 | | 1 − a | a − a² | a − a² | a − a² | a − a² |
| 3 | | | 1 − 2a + a² | a − 2a² + a³ | a − 2a² + a³ | a − 2a² + a³ |
| 4 | | | | 1 − 3a + 3a² − a³ | a − 3a² + 3a³ − a⁴ | a − 3a² + 3a³ − a⁴ |
| 5 | | | | | 1 − 4a + 6a² − 4a³ + a⁴ | a − 4a² + 6a³ − 4a⁴ + a⁵ |
| 6 | | | | | | 1 − 5a + 10a² − 10a³ + 5a⁴ − a⁵ |
| total | 1 | 1 | 1 | 1 | 1 | 1 | more desirable to implement the continuous concurrent test method for testing dice in a manufacturing process. The following equation defines a ratio between the gains of the one-time concurrent test method and the continuous concurrent test method:

$$\% \text{ better} = \frac{gain_{METHOD2} - gain_{METHOD1}}{gain_{METHOD1}} = \frac{\left(\dfrac{m\dfrac{q}{n}}{1-\left(1-\dfrac{q}{n}\right)^m} - 1\right)}{\left(\dfrac{m}{(m-1)\left(1-\dfrac{q}{n}\right)+1} - 1\right)}.$$

Figure 12:
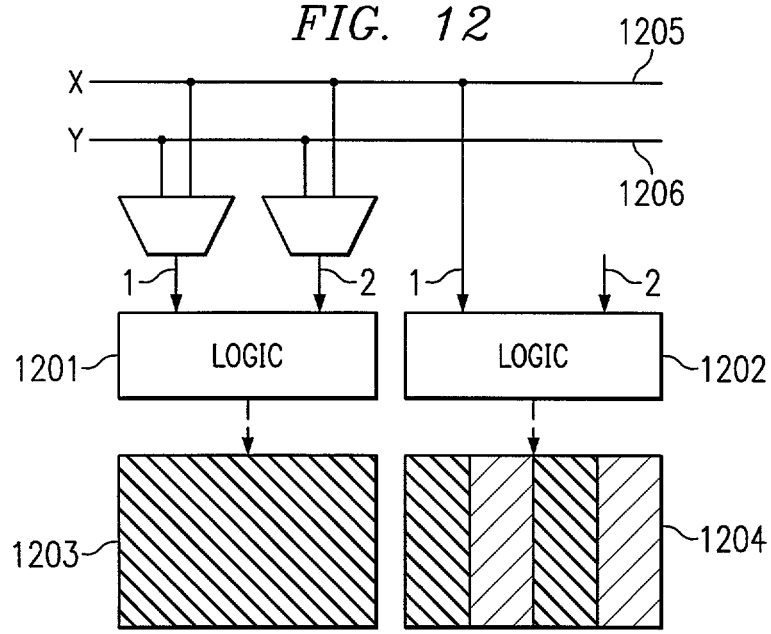
FIG. 12 shows an example of scheduling testing for a test scheme that utilizes a scan chain for inputting test data to two dice concurrently.

As an example, FIG. 12 illustrates an example of a test scheme that utilizes a scan chain for inputting test data to two dice concurrently, wherein the first die (shown as Logic 1201) receives 100% of the test data and the second die (shown as Logic 1202) concurrently receives 50% of the test data. Table 3 below shows an example of scheduling the test of the two dice of FIG. 12.

TABLE 3

| | CL1 | | | CL2 | |
|---|---|---|---|---|---|
| CLK I | Pin 1 | Pin 2 | CLK j | Pin 1 | Pin 2 |
| 1 | x:$A_1$ | y:$B_2$ | 1 | x:$A_1$ | |
| 2 | x:$A_2$ | y:$B_1$ | 2 | x:$A_2$ | |
| 3 | x:$A_3$ | y:$B_4$ | 3 | x:$A_3$ | |
| 4 | x:$A_4$ | y:$B_3$ | 4 | x:$A_4$ | |
| 5 | x:$A_I$ | y:$B_{j+1}$ | 5 | x:$A_j$ | |
| 6 | x:$A_I$ | y:$B_{j-1}$ | 6 | x:$A_j$ | |

As shown in the example of FIG. 12, logic 1201 may during a first clock receive input A1 from resource X (shown as resource 1205) via pin 1 of a test probe and receive input B2 from resource Y (shown as resource 1206) via pin 2 of a test probe. In this example, the inputs are synchronized vertically (this is needed if the input are independent scan chains). Input A1 is a first bit of a test pattern "A," and input B2 is a second bit of a test pattern "B." Concurrently therewith (i.e., in the first clock), logic 1202 receives input A1 from resource X via pin 1 of a test probe. That is, logic 1202 is interconnected so as to receive 50% of the input data input to logic 1201 in that logic 1202 receives the input data from pin 1 of a test probe concurrently with such input data being input to logic 1201.

Table 3 further shows clocks 2-6 in which the remaining bits of test patterns A and B are input to the dice via pins 1 and 2 of a test probe. At the conclusion of the first test sequence (i.e., clocks 1-6), the circuitry of logic 1201 is fully tested with test patterns A and B, as shown in block 1203, and the circuitry of logic 1202 is partially tested concurrently with the testing of dice 1203, as shown in block 1204. As can be seen from blocks 1203 and 1204 of FIG. 12, vertical synchronization is needed for this testing scheme.

Figure 13:
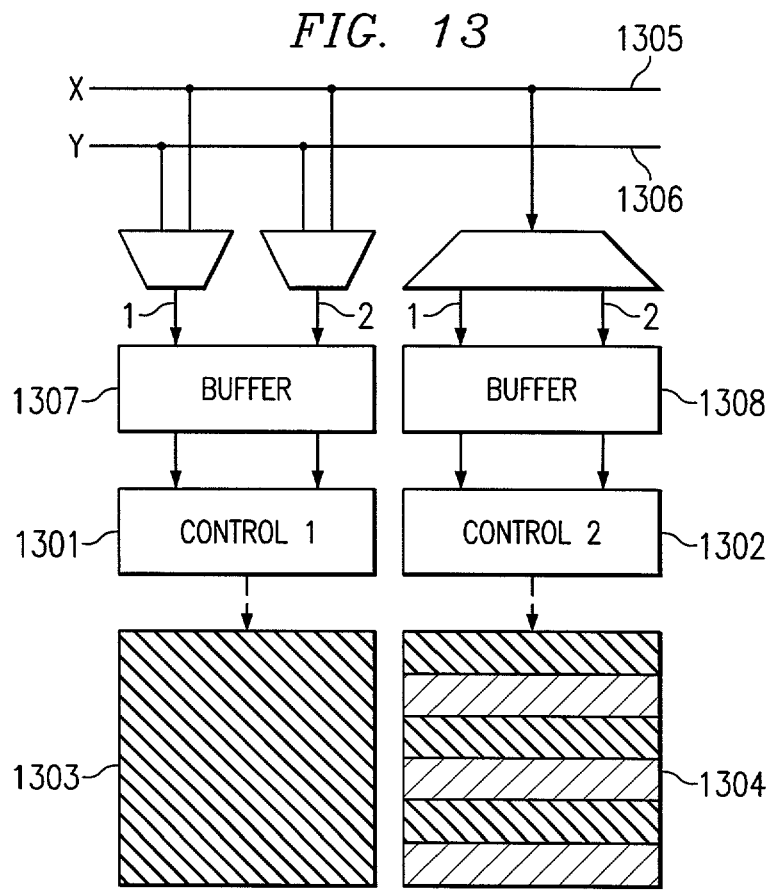
FIG. 13 shows an example of scheduling for a test scheme that utilizes direct access for inputting test data to two dice concurrently.

As another example, FIG. 13 illustrates an example of a test scheme that utilizes direct access for inputting test data to two dice (CUTs) concurrently, wherein the first die (shown as Logic 1301) receives 100% of the test data and the second die (shown as Logic 1302) concurrently receives 50% of the test data, in which the inputs are synchronized horizontally (this is needed if the inputs are directly connected to combinational logic/CUT). Table 4 below shows an example of the efficiency of testing the two dice of FIG. 13.

TABLE 4

| | CL1 | | | CL2 | |
|---|---|---|---|---|---|
| CLK I | Pin 1 | Pin 2 | CLK j | Pin 1 | Pin 2 |
| 1 | x:$A_1$ | y:$B_2$ | 1 | x:$A_1$ | x:$B_1$ |
| 2 | x:$A_2$ | y:$B_1$ | | | |
| 3 | X:$A_3$ | y:$B_4$ | 2 | x:$A_3$ | x:$B_4$ |
| 4 | x:$A_4$ | y:$B_3$ | | | |
| 5 | x:$A_i$ | y:$B_{j+1}$ | 3 | x:$A_{2j-2}$ | x:$B_{2j-2}$ |
| 6 | x:$A_i$ | y:$B_{i-1}$ | | | |

As shown in the example of FIG. 13, combinational logic 1301 may during a first clock receive input A1 from resource X (shown as resource 1305) via pin 1 of a test probe and receive input B2 from resource Y (shown as resource 1306) via pin 2 of a test probe. During the second clock, combinational logic 1301 may receive input A2 from resource X via pin 1 of a test probe and receive input B1 from resource Y via pin 2 of a test probe. Inputs A1 and A2 are the first and second bits, respectively, of a test pattern "A," and inputs B1 and B2 are the first and second bits, respectively, of a test pattern "B." As shown in FIG. 13, the input test data may be buffered in buffer 1307.

As shown, combinational logic 1302 is interconnected so as to concurrently receive input from resource X. Accordingly, in the first and second clocks combinational logic 1302 receives input A1 from resource X via pin 1 of a test probe, and receives input B1 from resource X via pin 2 of a test probe. That is, combinational logic 1302 is interconnected so as to receive 50% of the input data input to combinational logic 1301 in that logic 1302 receives the input data from resource X concurrently with such input data being input to logic 1301.

Table 4 further shows clocks 3-6 in which the remaining bits of test patterns A and B are input to the dice via pins 1 and 2 of a test probe. At the conclusion of the first test sequence (i.e., clocks 1-6), the circuitry of logic 1301 is fully tested with test patterns A and B, as shown in block 1303, and the circuitry of logic 1302 is partially tested concurrently with the testing of dice 1303, as shown in block 1304. As can be seen from blocks 1303 and 1304 of FIG. 13, horizontal synchronization is needed for this testing scheme.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for testing a plurality of dice on a semiconductor wafer, said system comprising:
a communication system included on said semiconductor wafer, said communication system interconnecting a plurality of dice on said semiconductor wafer for communicating test data from at least one of said plurality of dice to at least one other of said plurality of dice, said test data including error data outputted from one of said plurality of dice; and
wherein at least a portion of said system for testing a plurality of dice is implemented on a dedicated die for testing said plurality of dice, wherein said at least a portion of said system implemented on said dedicated die comprises a data processing system for processing test data for at least one of said plurality of dice.

2. The system of claim 1 further comprising:
at least one access pad for receiving input test data for said plurality of dice.

3. The system of claim 2 wherein said at least one access pad for receiving input test data is a die pad included in one of said plurality of dice.

4. The system of claim 1 further comprising:
at least one access pad for receiving output test data generated by said plurality of dice responsive to said input test data.

5. The system of claim 4 wherein said at least one access pad for receiving output test data is a die pad included in one of said plurality of dice.

6. The system of claim 1 wherein said data processing system comprises at least one selected from the group consisting of:
compression circuitry, decompression circuitry, die signature analyzer circuitry, comparator circuitry, PMU circuitry, FPGA circuitry, MPU circuitry, and built-in self test (BIST) circuitry.

7. The system of claim 1 wherein said data processing system comprises comparator circuitry for comparing output test data generated by at least one of said plurality of dice responsive input test data input to said at least one of said plurality of dice with expected output data for said at least one of said plurality of dice.

8. The system of claim 1 wherein said data processing system is implemented on at least one of said plurality of dice.

9. The system of claim 1 wherein at least a portion of said system for testing a plurality of dice is implemented on otherwise unused semiconductor wafer area.

10. The system of claim 1 wherein a portion of multiple dice is utilized to implement at least a portion of said system for testing a plurality of dice.

11. The system of claim 1 wherein said communication system implements an input scheme for inputting test data to said plurality of dice, wherein said input scheme is selected from the group consisting of:
broadcasting, pipelining external to said dice, and pipelining internal to said dice.

12. The system of claim 1 wherein said communication system implements an output scheme for outputting test data from said plurality of dice, wherein said output test scheme is selected from the group consisting of:
broadcasting using a comparator, pipelining external to said dice, pipelining internal to said dice, signature with broadcasting using a comparator, and signature with pipelining.

13. The system of claim 1 wherein said data processing system on said dedicated die is configured to compare said error data with an expected data value for at least one of said plurality of dice.

14. A method for testing a plurality of dice on a semiconductor wafer, said method comprising:
receiving test data at a semiconductor wafer having a plurality of dice fabricated thereon, wherein said receiving comprises receiving said test data from a test system implemented on at least one dedicated die of said semiconductor wafer; and
communicating said test data to multiple of said plurality of dice concurrently via a communication system fabricated on said semiconductor wafer that interconnects said multiple dice, wherein at least a portion of said test data is output test data responsive to input test data and is communicated from an output of at least one of said multiple dice to an input of at least one other of said multiple dice.

15. The method of claim 14 wherein said receiving step comprises:
receiving said test data via at least one access pad on said semiconductor wafer.

16. The method of claim 15 wherein said at least one access pad is a die pad included in one of said multiple dice.

17. The method of claim 14 wherein said receiving step comprises:
receiving said test data from a test system that is external to said semiconductor wafer.

18. The method of claim 14 further comprising:
generating output data for each of said multiple dice responsive to said received test data communicated thereto.

19. The method of claim 18 further comprising:
communicating said output data from at least one of said multiple dice to at least one other of said multiple dice.

20. The method of claim 18 wherein said generating said output data comprises using comparator circuitry on said semiconductor wafer for comparing output data generated by at least one of said multiple dice with expected output data for said at least one of said multiple dice.

21. A system for testing a plurality of dice on a semiconductor wafer, said system comprising:
circuitry fabricated on a semiconductor wafer, wherein said circuitry is defined by a repeatable reticle pattern and wherein said circuitry comprises a communication system interconnecting a plurality of dice on said semiconductor wafer for concurrently communicating test data to said plurality of dice, wherein said communication system interconnects said plurality of dice to communicate test data which is outputted from at least one of said plurality of dice and is inputted to at least one other of said plurality of dice.

22. The system of claim 21 wherein said circuitry further comprises:
a data processing system for processing test data for at least one of said plurality of dice.

23. The system of claim 22 wherein said data processing system comprises at least one selected from the group consisting of
compression circuitry, decompression circuitry, die signature analyzer circuitry, comparator circuitry, PMU circuitry, FPGA circuitry, MPU circuitry, and built-in self test (BIST) circuitry.

24. The system of claim 22 wherein said data processing system comprises comparator circuitry for comparing output test data generated by at least one of said plurality of dice responsive input test data input to said at least one of said plurality of dice with expected output data for said at least one of said plurality of dice.

25. The system of claim 22 wherein said data processing system is implemented on at least one of said plurality of dice.

26. The system of claim 21 further comprising:
at least a portion of said system for testing a plurality of dice is implemented on a dedicated die of said semiconductor wafer for testing said plurality of dice.

* * * * *